(12) United States Patent
Pachamuthu et al.

(10) Patent No.: US 11,587,618 B2
(45) Date of Patent: Feb. 21, 2023

(54) PREVENTION OF LATENT BLOCK FAILS IN THREE-DIMENSIONAL NAND

(71) Applicant: SanDisk Technologies LLC, Addison, TX (US)

(72) Inventors: Jayavel Pachamuthu, San Jose, CA (US); Siddharth Bhatt, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 18 days.

(21) Appl. No.: 17/213,349

(22) Filed: Mar. 26, 2021

(65) Prior Publication Data

US 2022/0310161 A1  Sep. 29, 2022

(51) Int. Cl.
| | | |
|---|---|---|
| G11C 16/04 | (2006.01) | |
| G11C 16/10 | (2006.01) | |
| G11C 16/14 | (2006.01) | |
| H01L 27/11582 | (2017.01) | |
| H01L 27/11565 | (2017.01) | |
| H01L 25/065 | (2023.01) | |

(52) U.S. Cl.
CPC .......... *G11C 16/0483* (2013.01); *G11C 16/10* (2013.01); *G11C 16/14* (2013.01); *H01L 27/11582* (2013.01); *H01L 25/0657* (2013.01); *H01L 27/11565* (2013.01)

(58) Field of Classification Search
CPC ..... G11C 16/0483; G11C 16/10; G11C 16/14; G11C 2213/71; G11C 11/06035; G11C 11/06064; G11C 11/063
USPC ................................................... 365/185.11
See application file for complete search history.

(56) References Cited

U.S. PATENT DOCUMENTS

| | | | |
|---|---|---|---|
| 8,902,657 | B2 | 12/2014 | Iwai et al. |
| 9,236,131 | B1 | 1/2016 | Yuan et al. |
| 9,418,751 | B1 | 8/2016 | Dutta et al. |
| 9,514,835 | B2 | 12/2016 | Magia et al. |
| 9,529,663 | B1 | 12/2016 | Srinivasan et al. |
| 9,934,872 | B2 | 4/2018 | Magia et al. |
| 10,128,257 | B2 * | 11/2018 | Pang ................. H01L 27/11553 |
| 10,453,535 | B2 | 10/2019 | Rajwade et al. |
| 10,691,372 | B1 * | 6/2020 | Seetharaman ....... G11C 16/349 |
| 10,886,002 | B1 | 1/2021 | Linnen et al. |
| 2016/0049421 | A1 | 2/2016 | Zhang et al. |
| 2017/0069650 | A1 * | 3/2017 | Iinuma .............. H01L 27/11565 |

* cited by examiner

*Primary Examiner* — Tha-O H Bui
(74) *Attorney, Agent, or Firm* — Vierra Magen Marcus LLP

(57) ABSTRACT

Technology is disclosed for detecting latent defects in non-volatile storage systems. Prior to writing data, a stress voltage is applied to SGS transistors in a 3D memory structure. After applying the stress voltage, the Vt of the SGS transistors are tested to determine whether they meet a criterion. The criterion may be whether a Vt distribution of the SGS transistors falls within an allowed range. If the criterion is not met, then a sub-block mode may be enabled. In the sub-block mode, data is not written to memory cells in a sub-block that contains SGS transistors whose Vt does not meet the criterion. Hence, the possibility of data loss due to defective SGS transistors is avoided. However, in the sub-block mode, data is written to memory cells in a sub-block that does not contain SGS transistors whose Vt does not meet the criterion. Hence, data capacity is preserved.

20 Claims, 25 Drawing Sheets

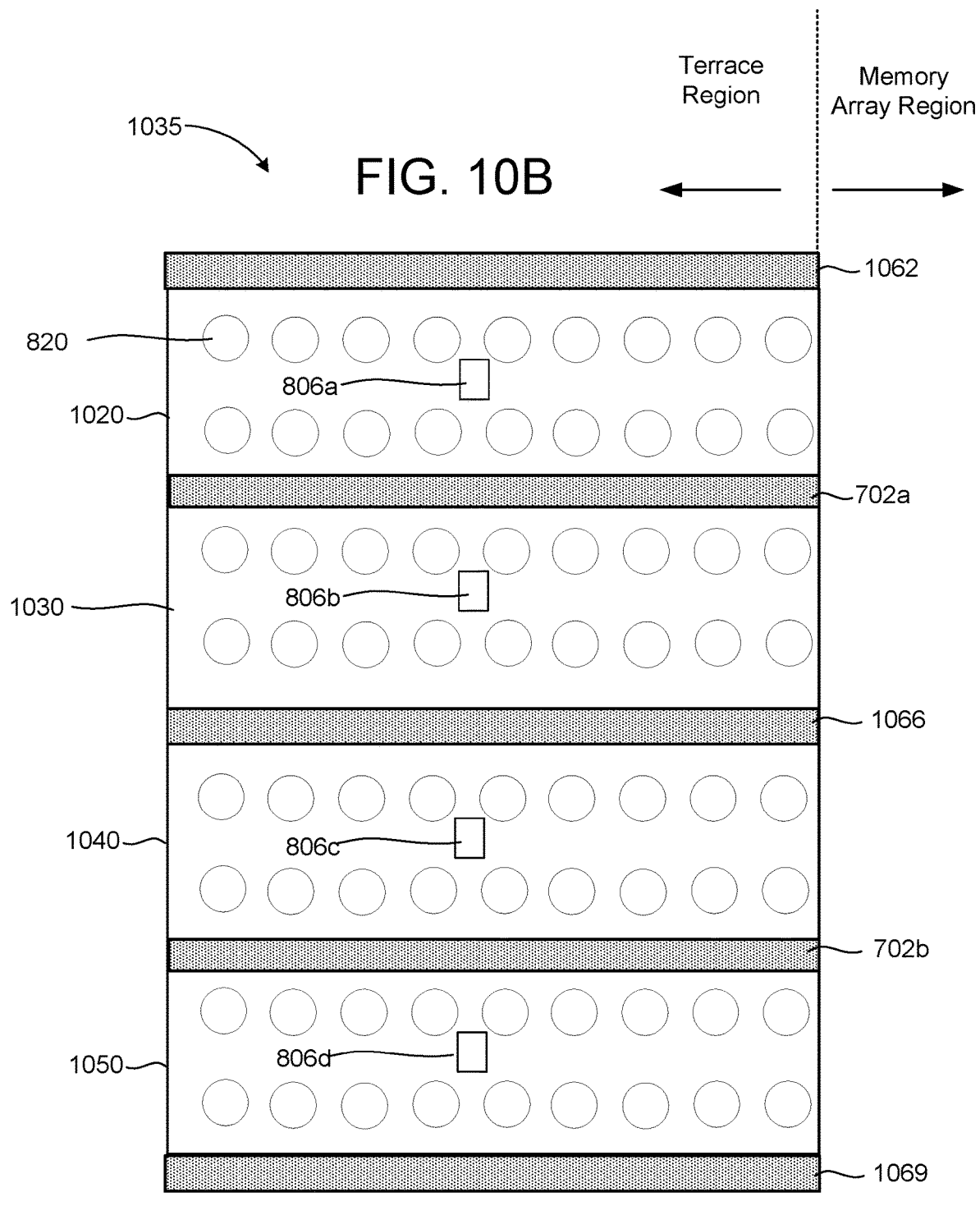

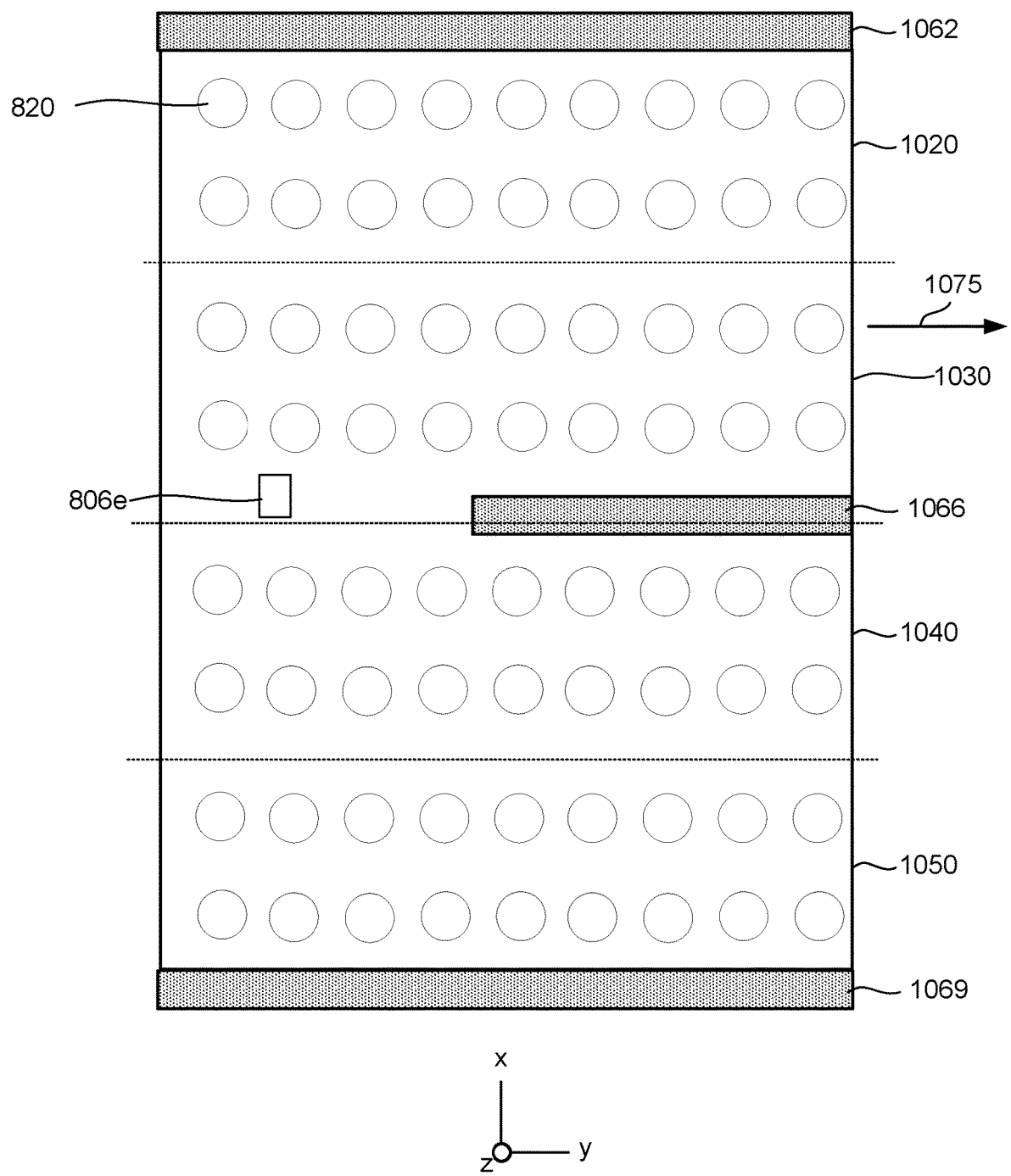

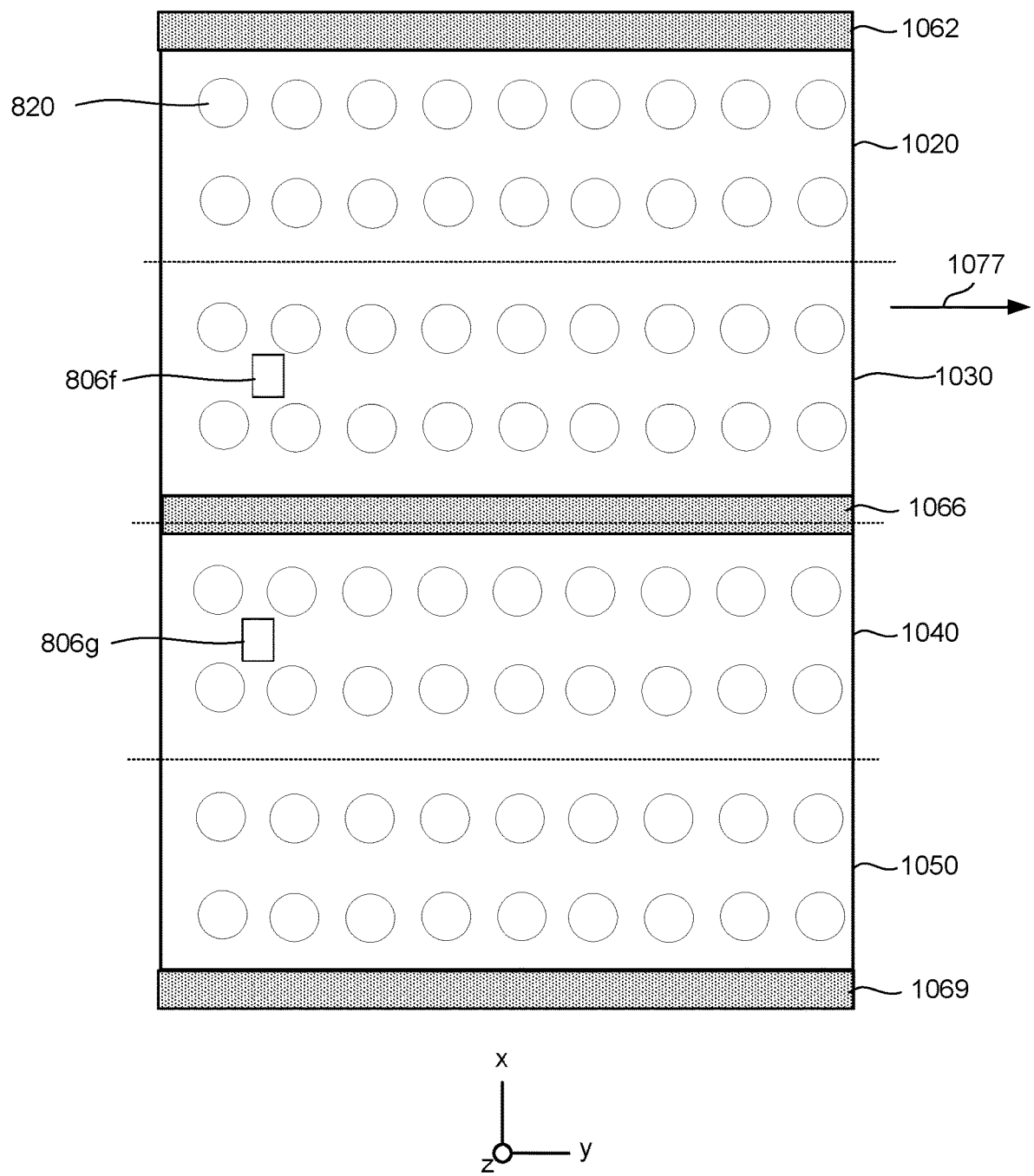

Selected Block

| | |
|---|---|
| BL | Float |
| SGD | V_Med |
| WLDD1 | Float |
| WLDD2 | Float |
| WL95 | Float |
| WL94 | Float |
| WL93 | Float |
| ⋮ | |
| WL6 | Float |
| WL5 | Float |
| WL4 | Float |
| WL3 | Float |
| WL2 | Float |
| WL1 | Float |
| WL0 | Float |
| WLDS2 | Float |
| WLDS1 | Float |
| SGS | V_High |
| CELSRC | GND |

FIG. 16A

Unselected Block

| | |
|---|---|
| BL | Float |
| SGD | GND |
| WLDD1 | Float |
| WLDD2 | Float |
| WL95 | Float |
| WL94 | Float |
| WL93 | Float |
| ⋮ | |
| WL6 | Float |
| WL5 | Float |
| WL4 | Float |
| WL3 | Float |
| WL2 | Float |
| WL1 | Float |
| WL0 | Float |
| WLDS2 | Float |
| WLDS1 | Float |
| SGS | GND |
| CELSRC | GND |

FIG. 16B

PREVENTION OF LATENT BLOCK FAILS IN THREE-DIMENSIONAL NAND

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWING

Like-numbered elements refer to common components in the different figures.

FIGS. 10A-10D are block diagrams each depicting a top view of a layer of one block of a 3D memory structure.

FIGS. 16A and 16B show voltages that are applied in a 3D memory structure during an embodiment of an SGS stress test.

DETAILED DESCRIPTION

Figure 1A:
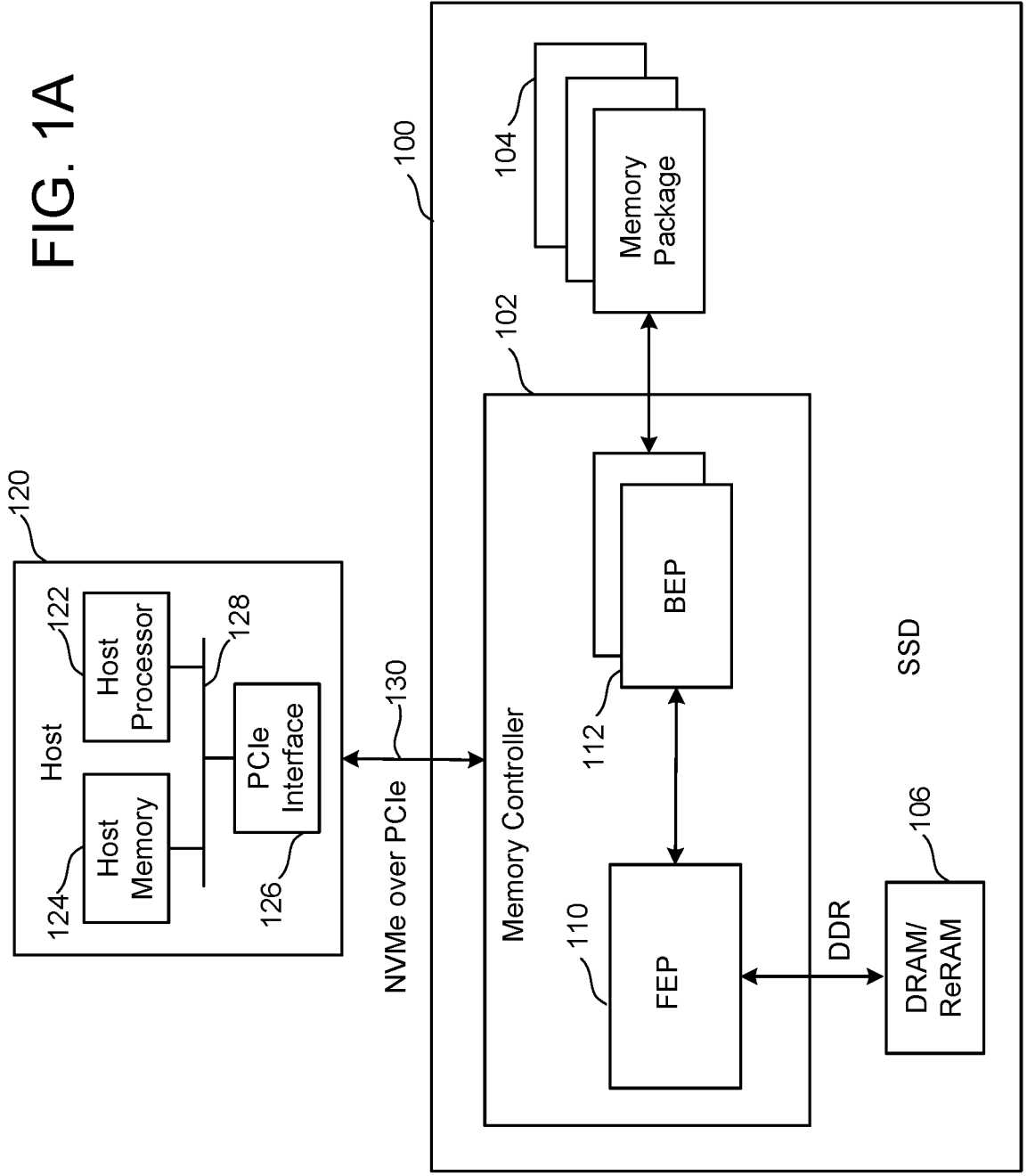
FIG. 1A is a block diagram of one embodiment of a storage system connected to a host.

The proposal described herein pertains to operating source select side transistors of NAND strings in a three-dimensional (3D) memory structure. The 3D memory structure contains blocks having NAND strings. The source select side transistors are at the bottom of the NAND strings, adjacent to a substrate below the 3D memory structure. The substrate may serve as a portion of a source line. Herein, for brevity, the source select side transistors may be referred to as SGS transistors. The control gates of a set of SGS transistors may share a common select line, which is referred to as an SGS line. This set of SGS transistors may include regular SGS transistors on NAND strings in a memory array region of the 3D memory structure, as well as dummy SGS transistors in a terrace region of the 3D memory structure.

Each SGS transistor has a body that is in direct electrical connection to the substrate below the 3D memory structure. A well-formed SGS transistor has a gate oxide between its control gate and body. However, a defect in an SGS transistor could result in an electrical short between the control gate and the substrate. This defect could be present when the 3D memory structure is fabricated but become more severe over time. For example, a portion of the material that forms the control gate could break through into the gate oxide during fabrication. In some cases, initially the defect is not severe enough to result in an electrical short, but the ordinary voltages applied to the SGS transistor during memory operations could make the defect worse. Thus, testing of the SGS transistors prior to use in the field might not detect a problem. However, during use in the field the defect could become so severe as to result in a malfunction. Hence, a "latent defect" can occur. It is possible for such a latent defect to result in loss of data stored in memory cells. Techniques are disclosed herein for detecting such latent defects in SGS transistors.

In an embodiment, the SGS transistors are tested prior to erasing a block of NAND strings. The test may comprise applying a stress voltage between the control gate of the SGS transistors and the substrate. After applying the stress voltage, the threshold voltages of the SGS transistors are tested to determine whether they meet a criterion. In one embodiment, the criterion is whether a threshold voltage (Vt) distribution of the SGS transistors falls within an allowed range. If the Vt distribution is not withing the allowed range, then a sub-block mode may be enabled. In the sub-block mode, data is not written to memory cells in a sub-block that contains SGS transistors whose Vt does not meet the criterion. Hence, the possibility of data loss due to defective SGS transistors is avoided. However, in the sub-block mode, data is written to memory cells in a sub-block that does not contain SGS transistors whose Vt does not meet the criterion. Hence, data capacity is preserved.

FIG. 1A-FIG. 11C describe one example of a storage system that can be used to implement the technology disclosed herein.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid-state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front-End Processor Circuit (FEP) 110 and one or more Back-End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two-dimensional NAND flash memory and/or three-dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory, or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
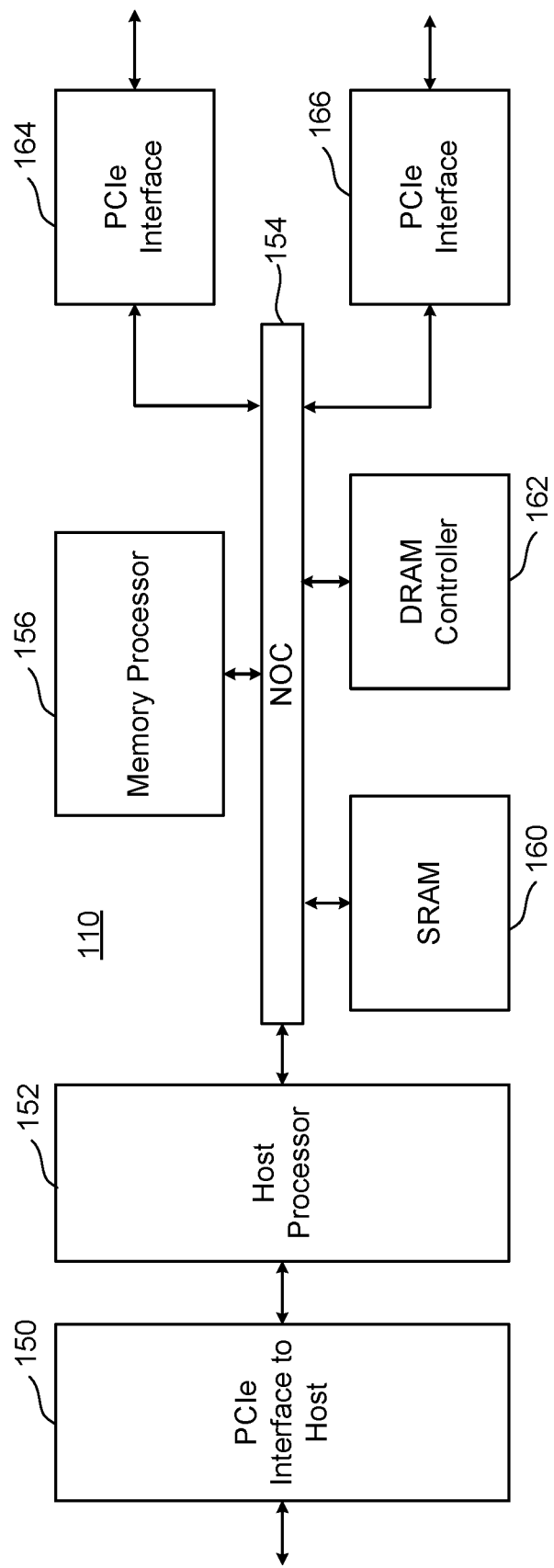
FIG. 1B is a block diagram of one embodiment of a Front-End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
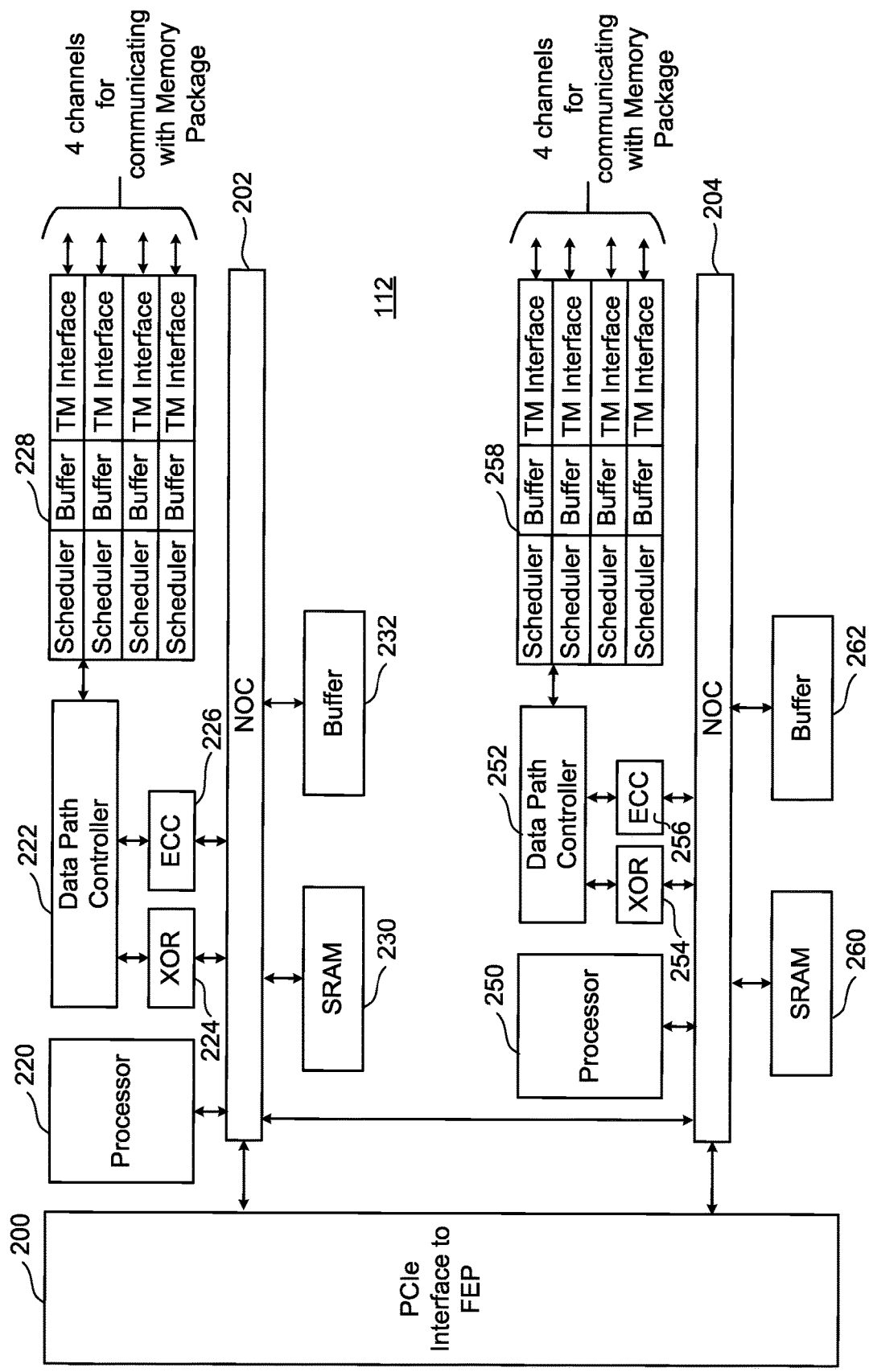
FIG. 2A is a block diagram of one embodiment of a Back-End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 can recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
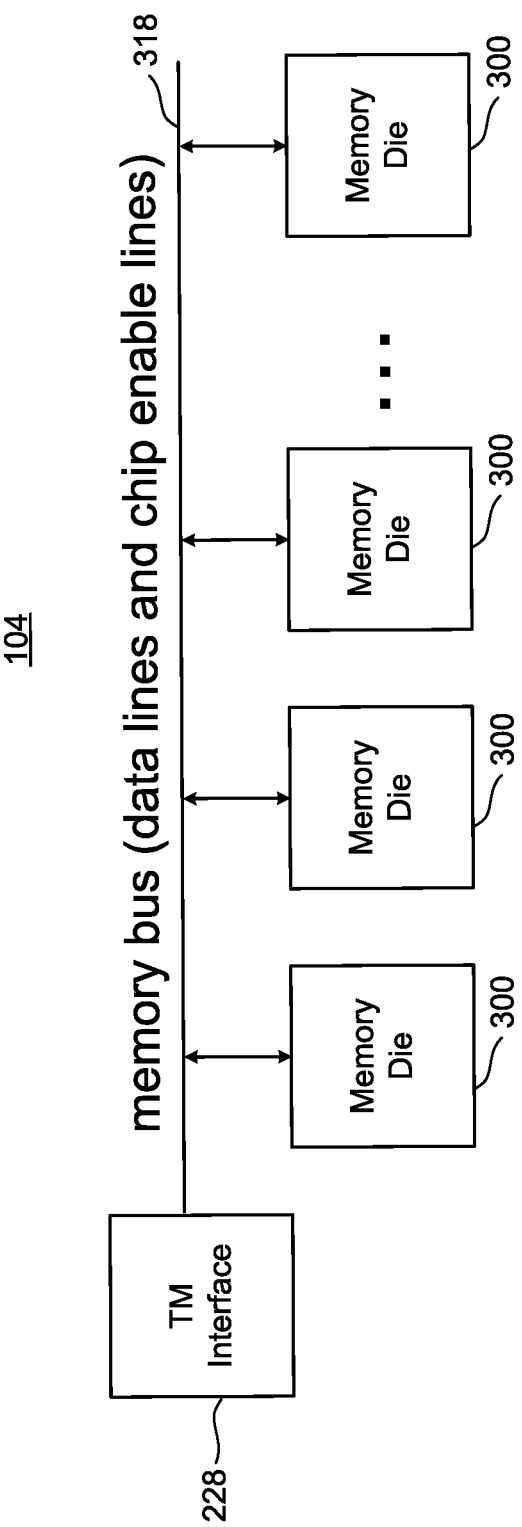
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or 16 memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
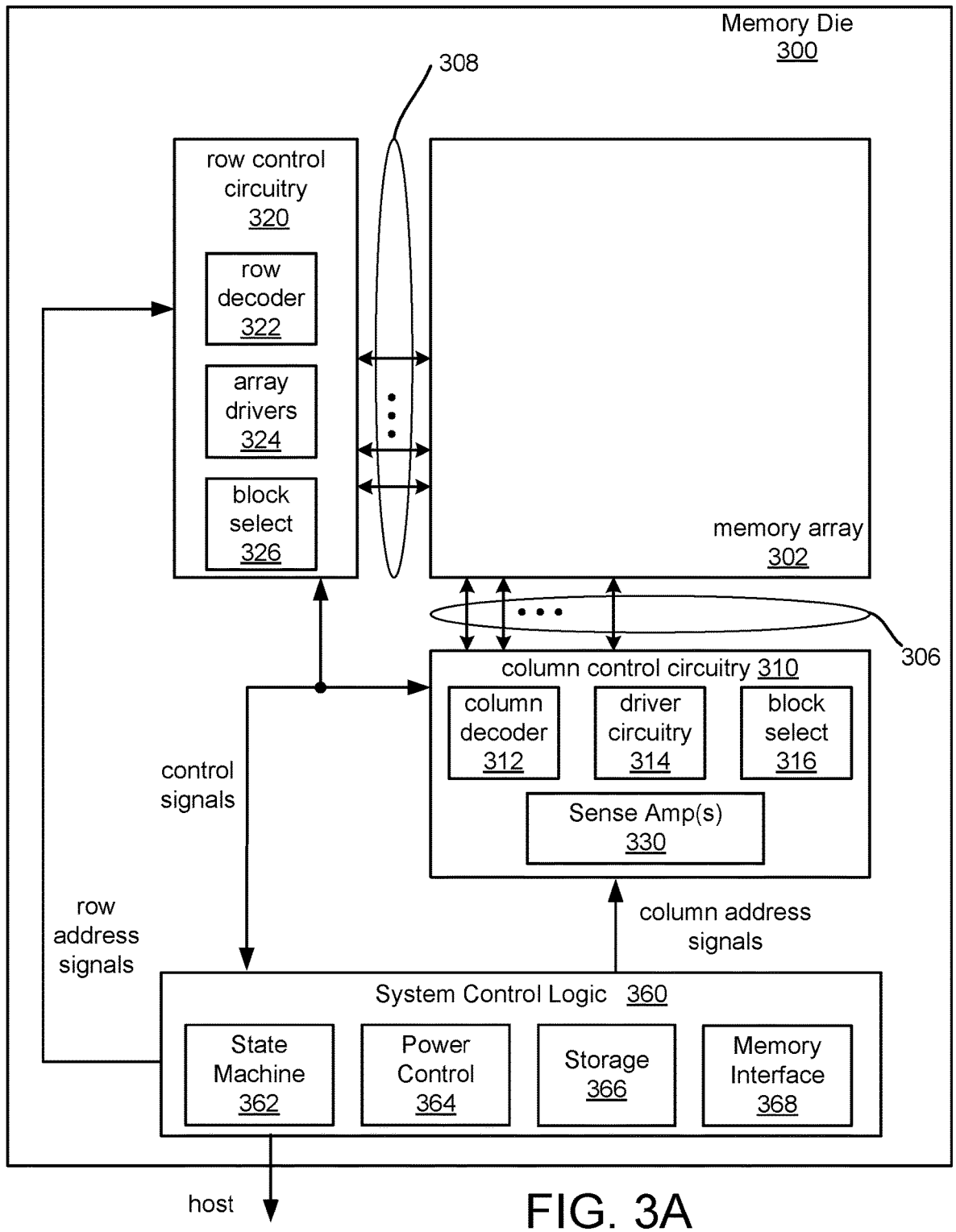
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
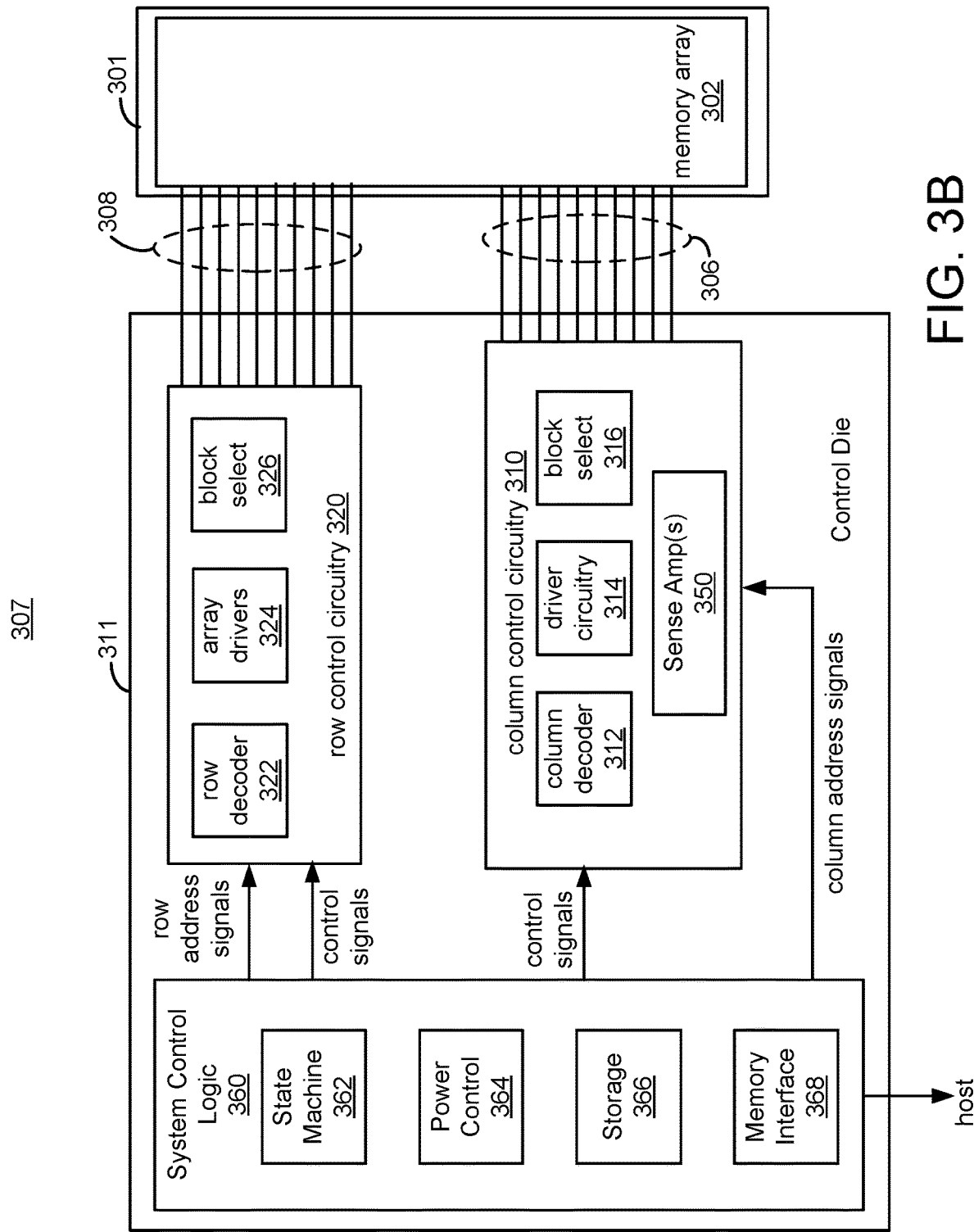
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302.

Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. System control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4A:
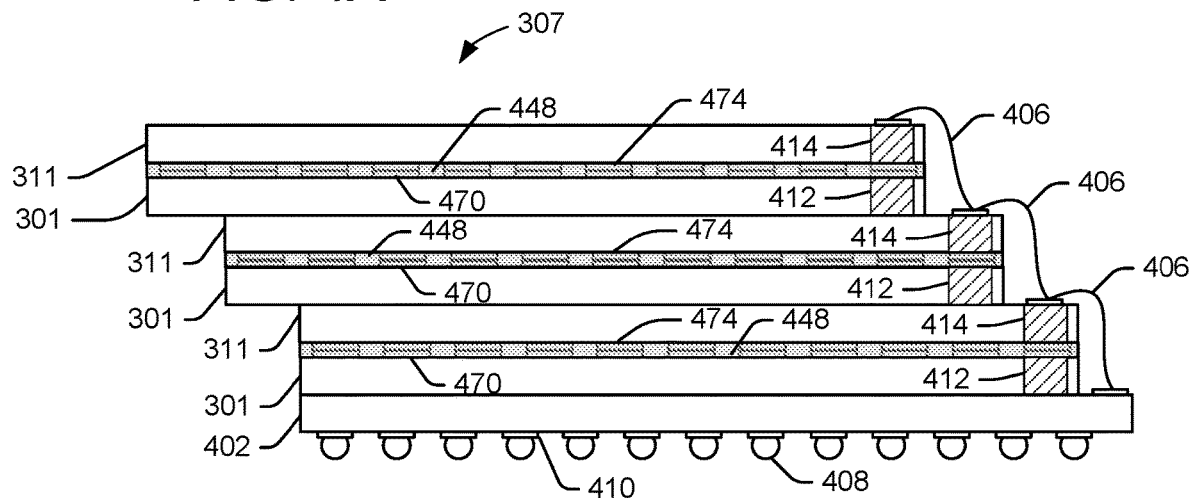
FIG. 4A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 4A depicts a side view of an embodiment of an integrated memory assembly 307 stacked on a substrate 402 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 470, 474, are depicted. There may be many more bond pads. A space between two dies 301, 311 that are bonded together is filled with a solid layer 448, which may be formed from epoxy or other resin or polymer. This solid layer 448 protects the electrical connections between the dies 301, 311, and further secures the dies together. Various materials may be used as solid layer 448, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 406 connected to the bond pads connect the control die 311 to the substrate 402. A number of such wire bonds may be formed across the width of each control die 311 (i.e., into the page of FIG. 4A).

A memory structure die through silicon via (TSV) 412 may be used to route signals through a memory structure die 301. A control die through silicon via (TSV) 414 may be used to route signals through a control die 311. The TSVs 412, 414 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package. The solder balls 408 may form a part of the interface between the integrated memory assembly 307 and the memory controller 102.

Figure 4B:
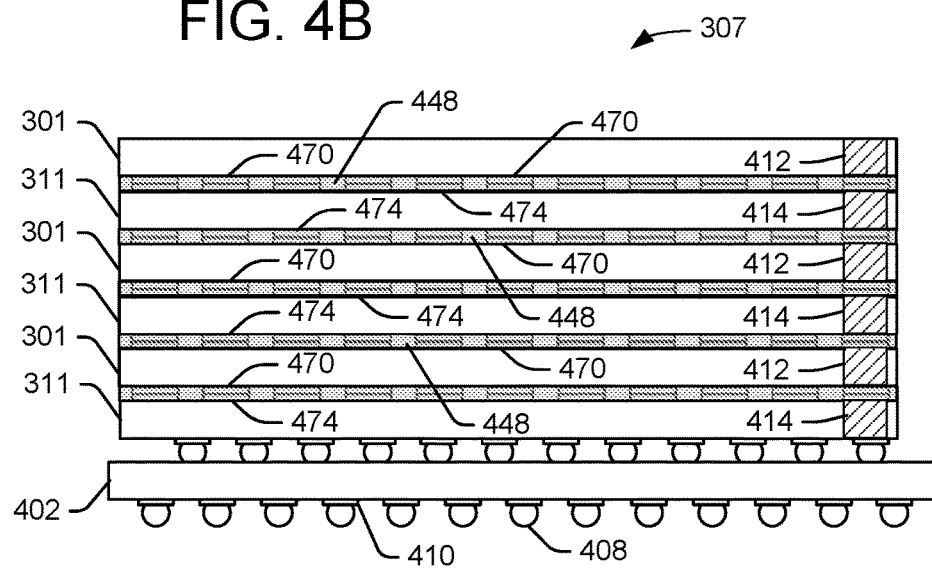
FIG. 4B depicts a side view of an embodiment of an integrated memory assembly stacked on a substrate.

FIG. 4B depicts a side view of an embodiment of an integrated memory assembly 307 stacked on a substrate 402. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 470, 474 are depicted. There may be many more bond pads. A space between two dies 301, 311 that are bonded together is filled with a solid layer 448, which may be formed from epoxy or other resin or polymer. In contrast to the example in FIG. 4A, the integrated memory assembly 307 in FIG. 4B does not have a stepped offset. A memory structure die through silicon via (TSV) 412 may be used to route signals through a memory structure die 301. A control die through silicon via (TSV) 414 may be used to route signals through a control die 311.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 5:
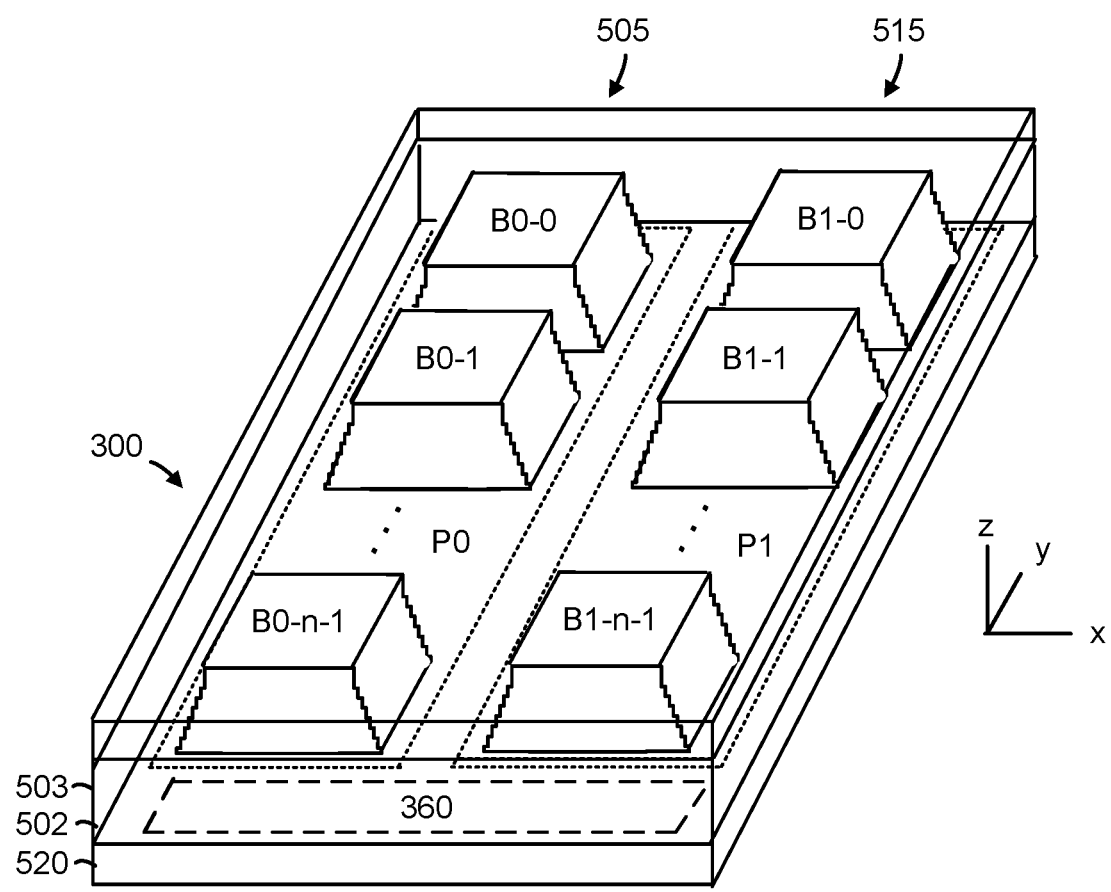
FIG. 5 is a perspective view of an example memory die in which blocks are provided in respective planes P0 and P1.

FIG. 5 is a perspective view of an example memory die 300 in which blocks are provided in respective planes P0 and P1. The memory die includes a substrate 520, an intermediate region 502 in which blocks of NAND strings are formed, and an upper region 503 in which one or more upper metal layers are patterned such as to form bit lines. Planes P0 and P1 represent respective isolation regions which are formed in the substrate 520. Further, a first block sequence 505 of a number n blocks, labelled B0-0 to B0-$n$-1, are formed in P0, and a second block sequence 515 of a number n blocks, labelled B1-0 to B1-$n$-1, are formed in P1. Each plane may have associated row and column control circuitry, such as the row control circuity 320 and column control circuity 310 of FIG. 3A.

The system control logic 360, which may reside in a peripheral area, may be shared among the planes, in one approach. Each plane may have a separate set of bit lines. In some embodiments, the system control logic 360 is located on a different die than the memory die 300.

By providing blocks of memory cells in multiple planes, parallel operations can be performed in the planes. For example, blocks in different planes can be erased concurrently.

The substrate 520 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 6:
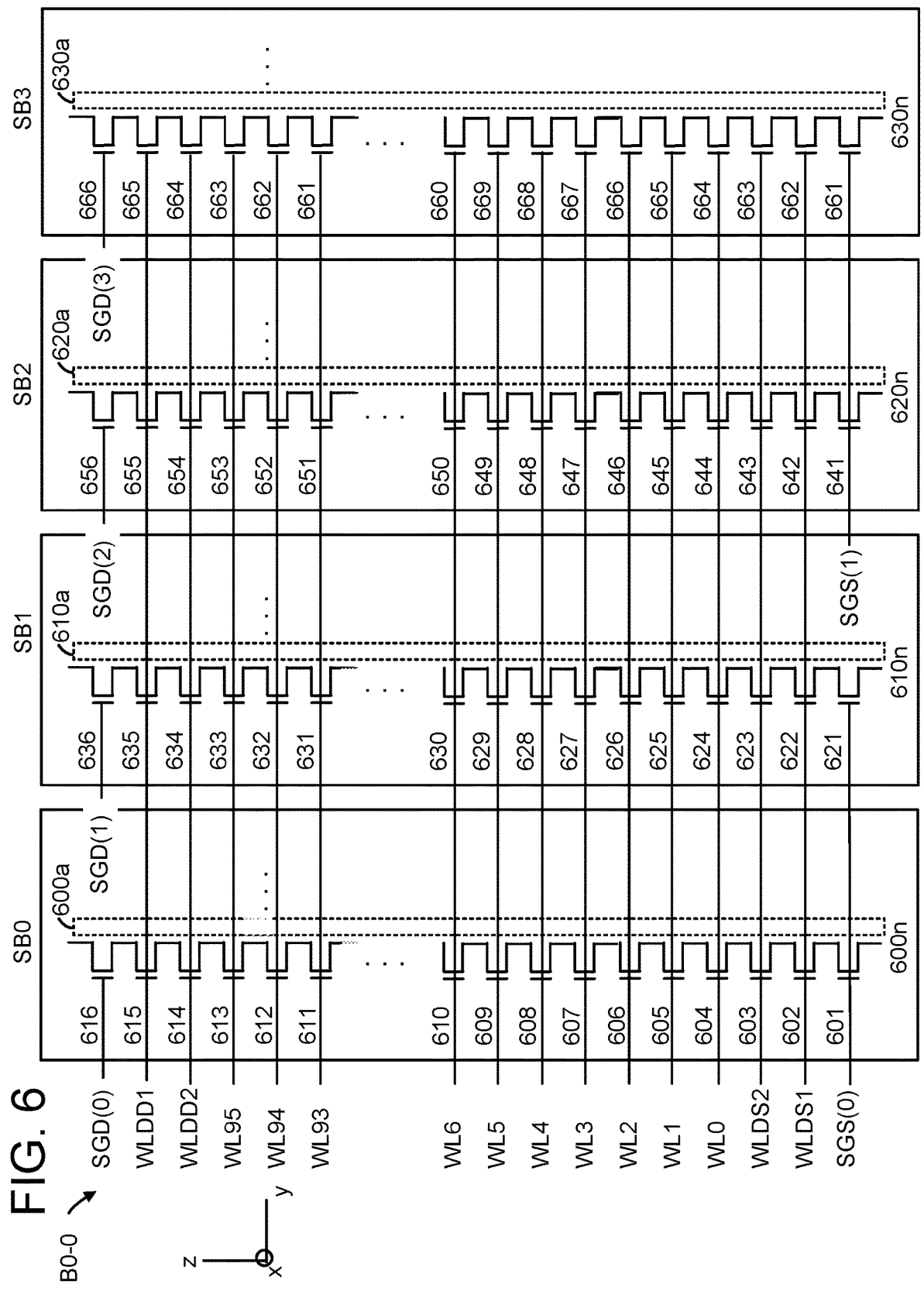
FIG. 6 depicts an example view of NAND strings in a block.

FIG. 6 depicts an example view of NAND strings in the block B0-0. The NAND strings are arranged in sub-blocks of the block in a 3D configuration. Each sub-block includes multiple NAND strings, where one example NAND string is depicted. For example, SB0, SB1, SB2 and SB3 comprise example NAND strings 600$n$, 610$n$, 620$n$ and 630$n$, respectively. The NAND strings are associated with data word lines, dummy word lines and select gate lines. Each sub-block comprises a set of NAND strings. An individual NAND string extends in the z direction. There are many NAND strings in each sub-block, with a set of NAND strings having a common SGD line extending in the x direction. The NAND strings 600$n$, 610$n$, 620$n$ and 630$n$ are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 600$n$, 610$n$, 620$n$ and 630$n$ have channels 600$a$, 610$a$, 620$a$ and 630$a$, respectively. Additionally, NAND string 600$n$ includes SGS transistor 601, source-side dummy memory cells 602 and 603, data memory cells 604-613, drain-side dummy memory cells 614 and 615 and SGD transistor 616. NAND string 610$n$ includes SGS transistor 621, source-side dummy memory cells 622 and 623, data memory cells 624-633, drain-side dummy memory cells 634 and 635 and SGD transistor 636. NAND string 620*n* includes SGS transistor 641, source-side dummy memory cells 642 and 643, data memory cells 644-653, drain-side dummy memory cells 654 and 655 and SGD transistor 656. NAND string 630*n* includes SGS transistor 661, source-side dummy memory cells 662 and 663, data memory cells 664-673, drain-side dummy memory cell 674 and 675 and SGD transistor 676.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD(2) and SGD(3), respectively, in one embodiment. The SGS transistors in SB0, SB1 may be driven by one control lines SGS(0), with SGS transistors in SB2, SB3 may be driven by another control lines SGS(1), in one embodiment. In some embodiments, all SGS transistors in the block are driven by the same SGS control line.

Figure 7:
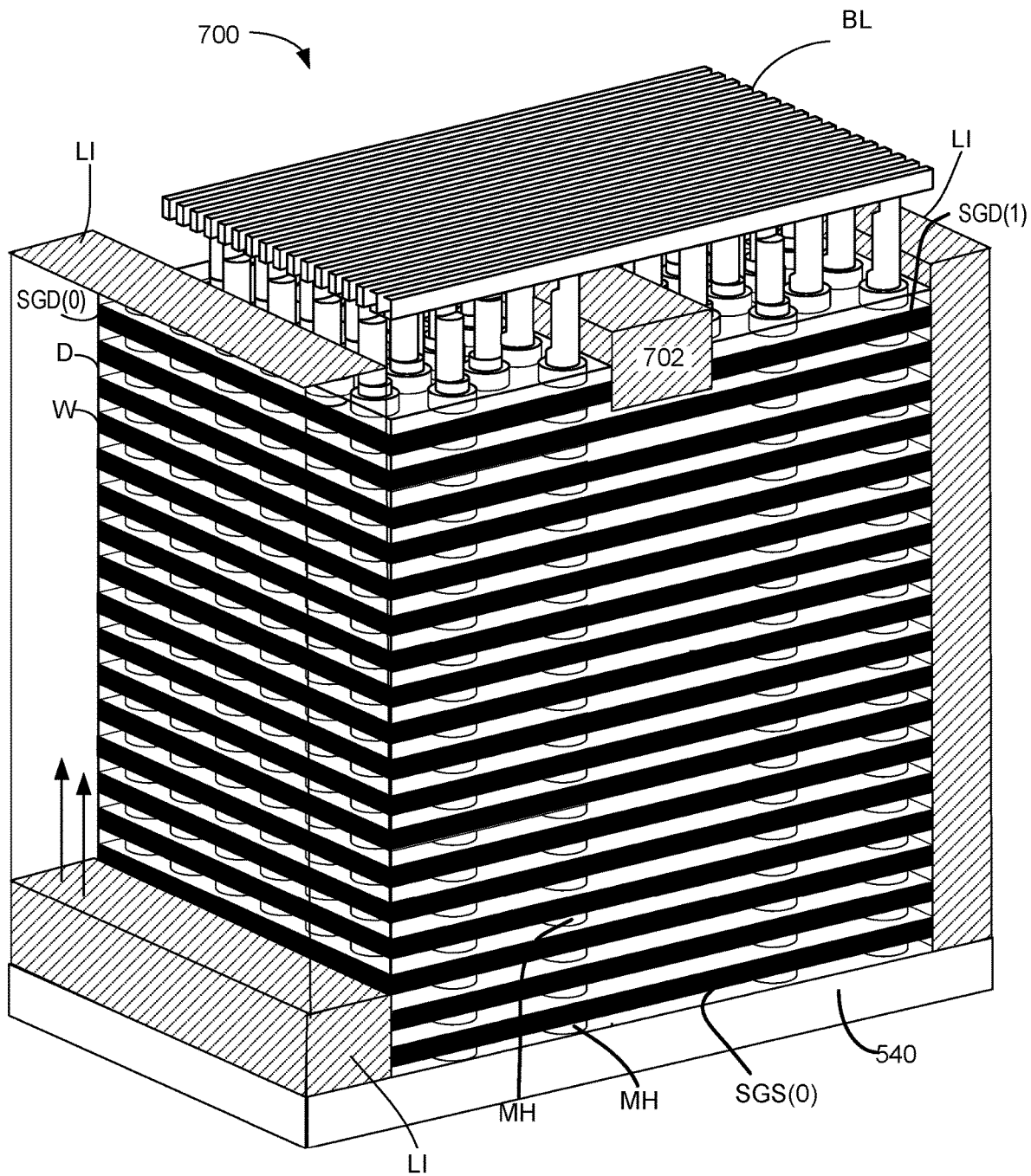
FIG. 7 is a perspective view on example embodiment of a monolithic three-dimensional (3D) memory structure having a memory array region and a terrace region.

FIG. 7 is a perspective view on example embodiment of a monolithic three-dimensional (3D) memory structure 700, which may form a portion of memory structure 302. The 3D memory structure 700 includes a plurality non-volatile memory cells arranged as NAND strings. For example, FIG. 7 shows a portion of one block. The 3D memory structure 700 of FIG. 7 shows a portion of two sub-blocks. For example, the 3D memory structure 700 may correspond to a portion of SB0 and SB1. The 3D memory structure 700 will extend in the y direction; therefore, the entire sub-blocks are not depicted in FIG. 7.

The 3D memory structure 700 includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The conductive layers may be referred to herein as horizontal conductive layers, as they are horizontal with respect to the substrate. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 4 select layers, 2 dummy word line layers and 104 dielectric layers. More or fewer than 108-304 layers can also be used.

Two local interconnects LI are depicted on opposite sides of the 3D memory structure 700. Only the lower portion of the LI on the left side of the 3D memory structure 700 is depicted, to allow clear depiction of the memory cells on that side. The two arrows on the lower portion of the LI indicate that the LI extends upwards, along the side of the 3D memory structure 700. An SGD etch structure 702 divides the SGD into SGD(0) and SGD(1). SGD(0) is in SB0 and SGD(1) is in SB1. The SGD etch structure 702 is an insulator, such as silicon oxide.

The lowermost conductive layer is an SGS layer. The SGS layer may correspond to SGS(0) in FIG. 6. Below the alternating dielectric layers and word line layers is the substrate 540, which may contain a source line (SL). Vertical columns of materials (also known as memory holes (MH)) are formed in the stack of alternating dielectric layers and conductive layers. For example, one of the vertical columns/memory holes is marked as MH. Note that in FIG. 7, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 8:
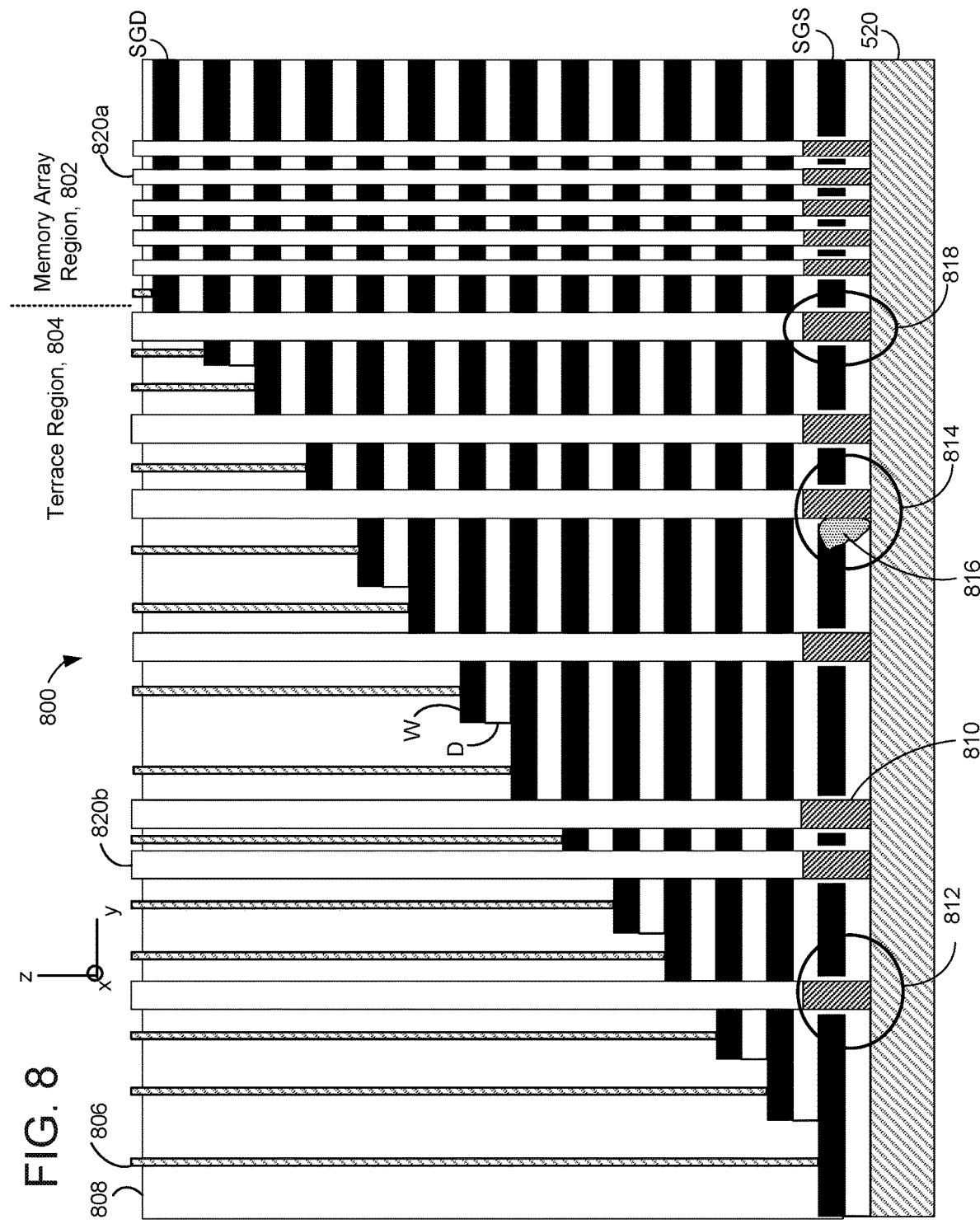
FIG. 8 is one example embodiment of a 3D memory structure.

FIG. 8 is one example embodiment of a 3D memory structure 800, which may form a portion of memory structure 302. The 3D memory structure 800 has a memory array region 802 and a terrace region 804. The 3D memory structure 800 has alternating dielectric layers and conductive layers. One of the dielectric layers is marked as D and one of the conductive layers (also called word line layers) is marked as W. Typically, there will be many more layers than depicted in FIG. 8. The conductive layers serve as the SGD, dummy WL, regular WL, and SGS. An electrical contact 806 is used to drive a conductive layer with a voltage. There is at least one electrical contact 806 for each conductive layer. The electrical contacts 806 reside within an insulator 808, such as silicon oxide. The voltage drivers are not depicted in FIG. 8.

A number of memory holes 820 are depicted. As discussed with respect to FIG. 7, the memory holes 820 are vertical columns of materials. Each of the memory holes has a conductive region 810 at the bottom of the MH. The conductive region 810 may be formed from, for example, silicon. In some embodiments, the silicon is crystallized. The conductive region 810 is in contact with the substrate 520. The conductive region 810 may serve as a body of an SGS transistor. The portion of the SGS that is adjacent to a conductive region 810 may serve as a control gate of the SGS transistor. For a well-formed SGS transistor, there will be an insulator between the SGS and the conductive region 810. Region 812 indicates a well-formed SGS transistor. Region 814 indicates an SGS transistor that is not well-formed. There is some material 816 creating an electrical short between the SGS line and the conductive region 810. Hence, the SGS line is shorted to the substrate 520 by way of the conductive region 810. The material 816 may also cause an electrical short directly from the SGS line to the substrate 520. Although this defect is depicted in the terrace region 804, such defects can also be present in the memory array region 802. Such defects can result in a failure of a sub-block, block, or an entire plane. In some cases, the defect can cause operational problems with other SGS transistors. Techniques are disclosed herein for detecting such defects. Moreover, after detecting the defect a block can be operated in a sub-block mode in which a portion of the block that is negatively impacted by the defect is not used for data storage. However, a portion of the block that is not negatively impacted by the defect continues to be used for data storage.

The memory array region 802 has regular memory holes 820*a* in which NAND strings are formed, as has been described with respect to FIG. 7. The terrace region also has memory holes. The memory holes in the terrace region could have a larger critical dimension than the memory holes in the memory array. At least some of the memory holes in the terrace region are what are referred to herein as a dummy memory hole 820*b*. A dummy memory hole is one in which the conductive region 810 is not in electrical contact with a NAND string channel. In contrast, for a regular memory hole the conductive region 810 is in electrical contact with a NAND string channel in the memory hole.

Figure 9A:
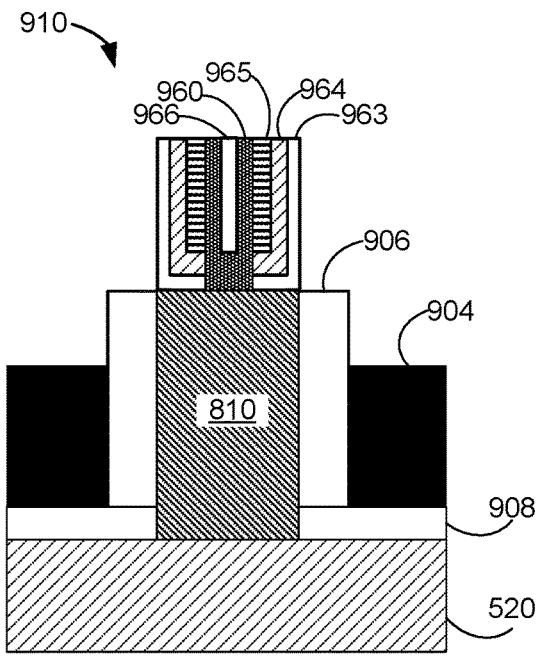
FIGS. 9A-9D depict various SGS transistors.
Figure 9B:
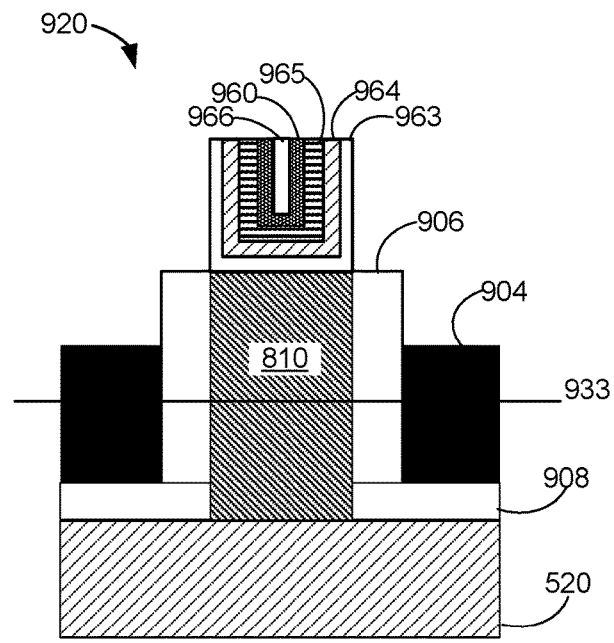
Figure 9C:
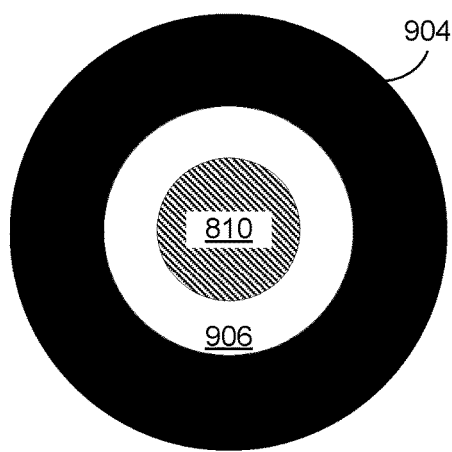
Figure 9D:
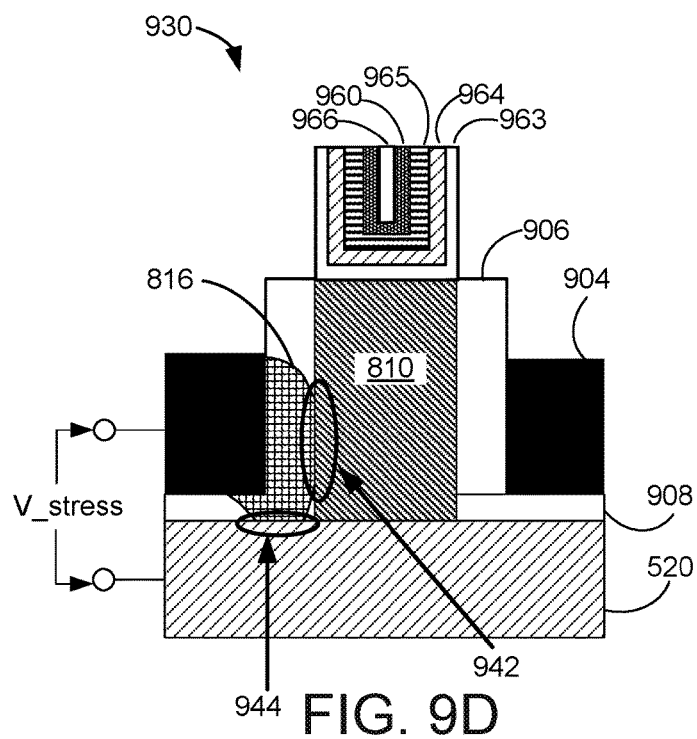

FIGS. 9A, 9B, and 9D provide close-up views of various regions of the structure 800 of FIG. 8. FIG. 9A depicts a close-up view of region 818, which depicts a regular SGS transistor. FIG. 9B depicts a close-up view of region 812, which depicts a well-formed dummy SGS transistor. FIG. 9D depicts a close-up view of region 814, which depicts a defective dummy SGS transistor.

Referring to FIG. 9A, the regular SGS transistor 910 has a control gate 904 that comprises a portion of the SGS line adjacent to the body 810. Gate oxide 906 resides between the control gate 904 and body 810. As noted above, the body 810 is formed in a memory hole. Also formed in the memory hole are several thin annular layers. The layers may include a blocking oxide layer 963, a charge-trapping layer 964 or film such as silicon nitride (Si3N4) or other nitride, a tunneling layer 965 (e.g., a gate oxide) and a channel layer 960 (e.g., comprising polysilicon). A dielectric core 966 (e.g., comprising silicon dioxide) can also be provided. The multiple thin layers form a columnar active area of a NAND string. Further details of the annular layers in a NAND string are shown and described with respect to FIG. 11A — 11C. Referring again to FIG. 9A, the body 810 of the SGS transistor 910 is in direct electrical contact with the channel layer 960. The body 810 is also in direct electrical contact with the substrate 520. The SGS line (or control gate 904) is separated from the substrate 520 by an insulator layer 908, which may be silicon oxide.

Referring now to FIG. 9B, the dummy SGS transistor 920 has a control gate 904 that comprises a portion of the SGS adjacent to the body 810. Gate oxide 906 resides between the control gate 904 and body 810. The body 810 is formed in a dummy memory hole in the terrace region 804. FIG. 9C depicts a cross-sectional view of the dummy SGS transistor along section line 933. The control gate 904, gate oxide 906, and body 810 are depicted. Referring again to FIG. 9B, also formed in the dummy memory hole are several thin annular layers. These may be the same layers that are formed in the regular memory hole. However, unlike the regular SGS transistor 910, the body 810 of the dummy SGS transistor 920 is not in electrical contact with the channel layer 960. Instead, the body 810 contacts the blocking oxide layer 963. However, the body 810 of the dummy SGS transistor 920 is in direct electrical contact with the substrate 520. Also, the SGS line (or control gate 904) is separated from the substrate 520 by an insulator layer 908, which may be silicon oxide.

It is possible for there to be electrical short between the control gate 904 of an SGS transistor and the substrate 520. FIG. 9D depicts an SGS transistor 930 having a defect 816. The defect 816 may be electrically conductive. The defect 816 could contain the same material of which the SGS is made. For example, the defect 816 could contain metal, such as Tungsten. However, the defect 816 is not necessarily entirely metal. Hence, the conductively of the defect 816 could be somewhat lower than the conductivity of the SGS line 904. Depending on factors such as size, location, and conductivity of the defect 816, the defect may result in an electrical short to the substrate 520. The defect 816, as depicted in FIG. 9D, is in direct contact to the control gate 904. A portion 942 of the defect 816 is in direct contact with the body 810, which may result in an electrical short between the control gate 904 and the body 810. Because the body 810 is in direct electrical contact to the substrate 520 this results in a short between the control gate 904 and the substrate 520. A portion 944 of the defect 816 is in direct contact with the substrate 520, which may result in an electrical short between the control gate 904 and the substrate 520. Hence if the defect causes an electrical short between the control gate 904 and either the body 810 or directly to the substrate 520, there will be an electrical short between the control gate 904 and substrate 520.

In an embodiment, an SGS stress test is performed to detect whether such defects are severe enough to cause operational problems with a set of SGS transistors. In an embodiment, the SGS stress test places a stress voltage between the control gate 904 of an SGS transistor and the substrate 520 below the SGS transistor. FIG. 9D shows a stress voltage (V_stress) placed between the control gate 904 and the substrate 520. Since the substrate 520 is electrically connected to the body 810 of the SGS transistor, this will place a stress voltage between the control gate 904 and the body 810. The stress voltage may be greater in magnitude than voltages that are typically applied between the control gate 904 and substrate 520 during read or program operations. In one embodiment, the stress voltage is about 17 V, but could be higher or lower. In one embodiment, the substrate 520 is biased to a higher voltage than the control gate. For example, the control gate 904 may be grounded, with the substrate 520 biased to about 17V. The stress voltage may result in conduction of current between the control gate 904 and the substrate 520 (referred to herein as an SGS leakage current). It is possible for this SGS leakage current to negatively impact other SGS transistors in the memory structure. Moreover, there could be such an SGS leakage current even if a lower voltage is applied between the control gate 904 and substrate 520, such as during a read or program operation. Hence, such an SGS leakage current could negatively impact memory array operation.

After applying the stress voltage to SGS transistors connected to an SGS line, the Vt of the SGS transistors may be tested. This test may be performed on a sub-block basis, such as testing the Vt distribution of the SGS transistors in a sub-block (e.g., SB0, SB1, SB2, and/or SB3). If the Vt distribution is not within an allowed range, then a portion of the block that contains the SGS transistors that failed the Vt test is not used to store data. As will be explained more fully below, in one embodiment, an upper tier is used to store data, but a lower tier is not used to store data. In one embodiment, the delineation is made based on sub-blocks depicted in FIG. 6.

The defect 816 could be present when the 3D memory structure is manufactured. However, the defect 816 could become worse over time as the 3D memory structure is operated. For example, the repeated stress of applying normal operating voltages between the control gate 904 and the body 810, or between the control gate 904 and the substrate 520 could cause the defect 816 to expand in size and/or increase in conductively. Hence, even if there is not an electrical short shortly after manufacture, an electrical short could develop during normal memory operation.

The defect 816 could occur in either a regular SGS transistor or in a dummy SGS transistor. Not only will the defect negatively impact operation of the SGS transistor in which the defect is present, but the defective SGS transistor may negatively impact operation of other SGS transistors in the memory structure. For example, a single defective dummy SGS transistor in a selected block could negatively impact operation of many regular SGS transistors in the selected block. It is possible for such negative impacts to result in data loss. However, techniques are disclosed herein to pro-actively detect such SGS transistor defects prior to writing data in a portion of the memory structure that may be impacted by the defect. This portion of the memory structure may be tagged as not eligible to store data. Hence data loss is prevented. Moreover, other portions of the memory structure that are not impacted by the defect remain eligible to store data. Hence, data capacity remains high.

Figure 10A:
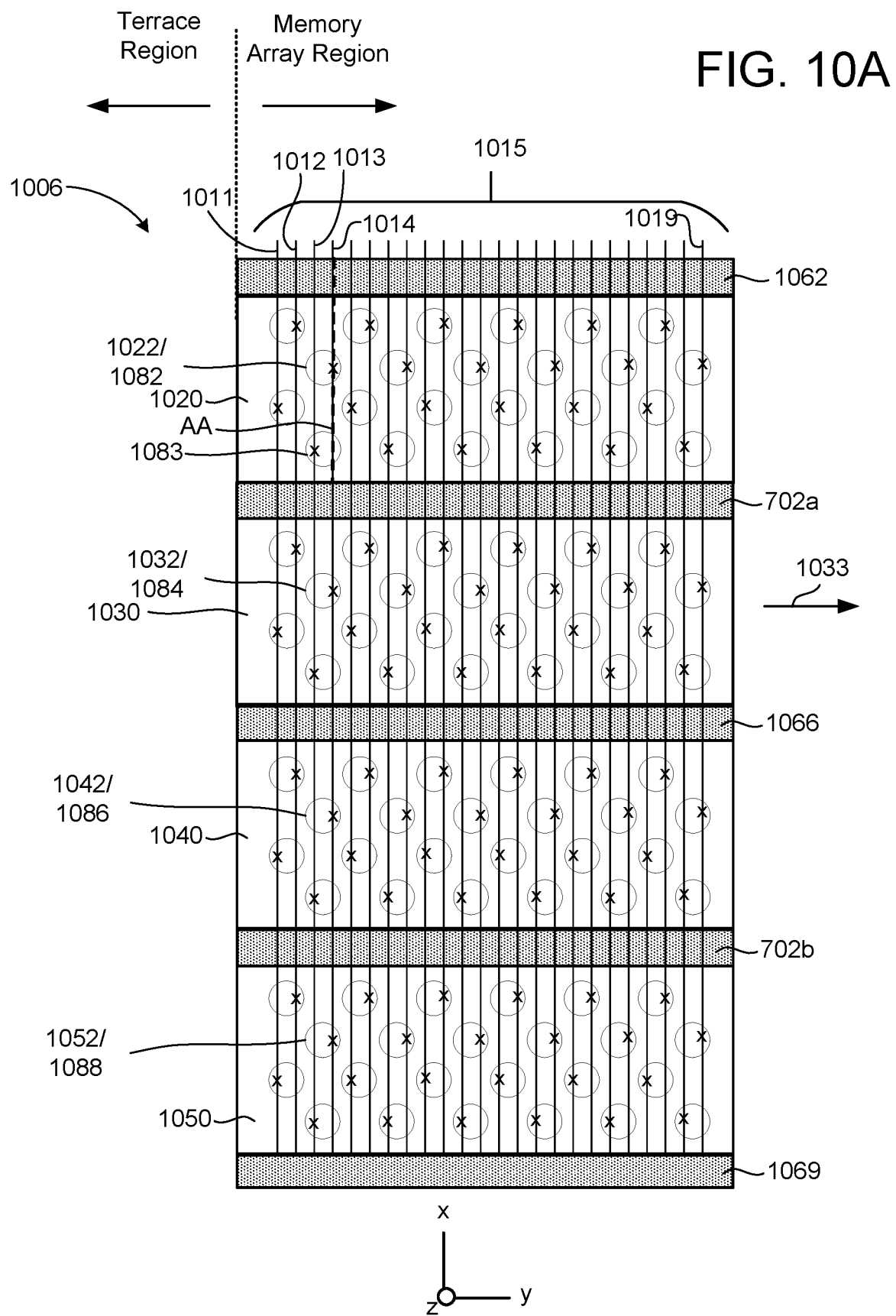

FIGS. 10A-10D depict views of a portion of respective layers of the 3D memory structure to provide further details of how a block may be divided into sub-blocks, as well as other aspects. FIG. 10A is a diagram depicting a top view of a portion of one block from memory structure 302. The portion of the block depicted in FIG. 10A contains four sub-blocks, as in the example of FIG. 6. The portion corresponds to the memory array region (see FIG. 8, 802). As can be seen from FIG. 10A, the block extends in the direction of arrow 1033. FIG. 10A only shows the top layer (e.g., SGD layer).

FIG. 10A depicts a plurality of circles that represent the vertical columns (or memory holes). Each of the vertical columns include multiple select transistors and multiple memory cells. In one embodiment, each vertical column implements a NAND string. For example, FIG. 10A depicts vertical columns 1022, 1032, 1042 and 1052. Vertical column 1022 implements NAND string 1082. Vertical column 1032 implements NAND string 1084. Vertical column 1042 implements NAND string 1086. Vertical column 1052 implements NAND string 1088. More details of the vertical columns are provided below. Since the block depicted in FIG. 10A extends in the direction of arrow 1033, the block includes more vertical columns than depicted in FIG. 10A.

FIG. 10A also depicts a set of bit lines 1015, including bit lines 1011, 1012, 1013, 1014, . . . 1019. FIG. 10A shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 1014 is connected to vertical columns 1022, 1032, 1042 and 1052.

The block depicted in FIG. 10A includes a set of local interconnects (LI) 1062, 1066, and 1069 that connect to the substrate 520 below the vertical columns. The block depicted in FIG. 10A includes two SGD etch structures 702a, 702b. FIG. 7 depicts how the LI connect down to the substrate 520, and how an SGD etch structure 702 divides the SGD layer that is between two LIs into two regions (e.g., SGD(0) and SGD(1)). Hence, LIs 1062, 1066, and 1069 and SGD etch structures 702a, 702b divide the SGD layer of the block into four regions. For example, the layer depicted in FIG. 10A is divided into regions 1020, 1030, 1040 and 1050, which are referred to as sub-blocks (e.g., SB0, SB1, SB2, and SB3). In the lower layers of the block that implement memory cells, it is not required for the two SGD etch structures 702a, 702b to be present (see, FIG. 7). However, optionally, the two SGD etch structures 702a, 702b could extend down to the substrate 520. By providing four separate SGD lines, the block can be operated as four sub-blocks. In some embodiments, the word line regions at a given level connect together at the end of the block (in the terrace region 804) to form a single word line. In another embodiment, the word line regions on the same level are not connected together.

In one example implementation, a bit line only connects to one vertical column in each of regions 1020, 1030, 1040 and 1050. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 10A shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 10A also shows the vertical columns being staggered. In other embodiments, different patterns of staggering can be used. In some embodiments, the vertical columns are not staggered.

FIG. 10B is a diagram depicting a top view of a portion of one block from memory structure 302. The portion of the block depicted in FIG. 10B contains four sub-blocks, as in the example of FIG. 6. The portion corresponds to a portion of the terrace region (see FIG. 8, 804). FIG. 10B only shows one layer 1035, which is this case is an SGD layer. FIG. 10B shows a portion of the same SGD layer that is depicted in FIG. 10A.

FIG. 10B shows that the terrace region extends the four regions 1020, 1030, 1040 and 1050 that are in the memory array region. The local interconnects (LI) 1062, 1066, and 1069 are also depicted. Also, the two SGD etch structures 702a, 702b are shown. An electrical contact 806 connects to each region to provide operating voltages to the SGD line. For example, contact 806a is used to provide operating voltages to region 1020 (e.g., SGD(0); contact 806b is used to provide operating voltages to region 1030 (e.g., SGD(1); contact 806c is used to provide operating voltages to region 1040 (e.g., SGD(2); and contact 806d is used to provide operating voltages to region 1050 (e.g., SGD(3)).

A number of memory holes 820 are depicted in FIG. 10B. These may be regular memory holes and/or dummy memory holes. As noted above, for a regular memory hole, the body of the SGS transistor is electrically connected to a channel layer (e.g., NAND channel) in the memory hole. However, for a dummy memory hole the body of the SGS transistor is not electrically connected to a NAND channel. In some embodiments, the memory holes that are closest to the array region are regular memory holes. In one embodiment, the critical dimension (CD) of the memory holes in the terrace region is about twice the CD of the memory holes in the memory array region.

In some embodiments, layers below the SGD layer have a similar configuration in the terrace region as depicted in FIG. 10B. That is, the layers can be divided into four electrically isolated regions. However, in one embodiment, the different regions are electrically connected at some point in the terrace. FIG. 10C depicts an embodiment in which the four regions are electrically connected at the end of the terrace. FIG. 10C shows a top view of the end portion of the terrace region for one layer 1045 of the memory structure. This could be a word line layer, SGD layer, or SGS layer, for example. Local interconnects 1062 and 1069 extend across the entire terrace at this level. However, LI 1066 only extends partially across the terrace region. In the depicted embodiment, the SGD etch structures 702a, 702b are not present at this level of the terrace region. The four regions 1020, 1030, 1040, 1050 that were discussed in connection with FIGS. 10A and 10B are depicted. However, these regions are not required to be electrically isolated from one another. The dashed lines between the regions indicates that, in this embodiment, the regions are not electrically isolated from one another. Arrow 1075 indicates that the terrace extends in that direction to the memory array region. Contact 806e connects to the layer 1045 to provide operating voltages for this layer 1045.

A number of memory holes 820 are depicted in FIG. 10C. These may be regular memory holes and/or dummy memory holes. As noted above, for a regular memory hole, the body of the SGS transistor is electrically connected to a channel layer (e.g., NAND channel) in the memory hole. However, for a dummy memory hole the body of the SGS transistor is not electrically connected to a NAND channel.

FIG. 10D depicts a top view of one layer in the terrace region. FIG. 10D depicts an embodiment in which there are two electrically isolated regions in the terrace region. Local interconnect 1066 extends across the entire terrace region at this layer 1045 to provide electrical isolation between the pair of regions 1020/1030 and the pair of regions 1040/1050. Note that local interconnect 1066 should also extend across the memory array region at this layer to provide electrical isolation between the pair of regions 1020/1030 and the pair of regions 1040/1050. Arrow 1077 shows that the terrace region extends to the memory array region. Electrical contact 806f connects to regions 1020/1030 to provide operational voltages to regions 1020/1030. Electrical contact 806g connects to regions 1040/1050 to provide operational voltages to regions 1040/1050. For the sake of discussion, regions 1020/1030 may be referred to as a first finger and regions 1040/1050 may be referred to as a second finger.

In one embodiment, the SGS layer is configured as in FIG. 10D, which permits operating at a sub-block mode in which regions 1020 and 1030 are one sub-block, and regions 1040 and 1050 are another sub-block. For example, if the SGS transistors in the sub-block within regions 1020 and 1030 are defective, but the SGS transistors in the sub-block within regions 1040 and 1050 are operational, then sub-block 1040/1050 may be used to store data. On the other hand, sub-block 1020/1030 may be tagged as ineligible to store data.

In some embodiments, the SGS layer has a configuration as in FIG. 10B. That is, the SGS layer is divided into four electrically isolated regions 1020, 1030, 1040, and 1050 in both the memory array and terrace regions. Hence, if the SGS transistors in one of the regions are not operating correctly, the SGS transistors in other regions can still be used during memory operations (e.g., erase, program, read).

Figure 11A:
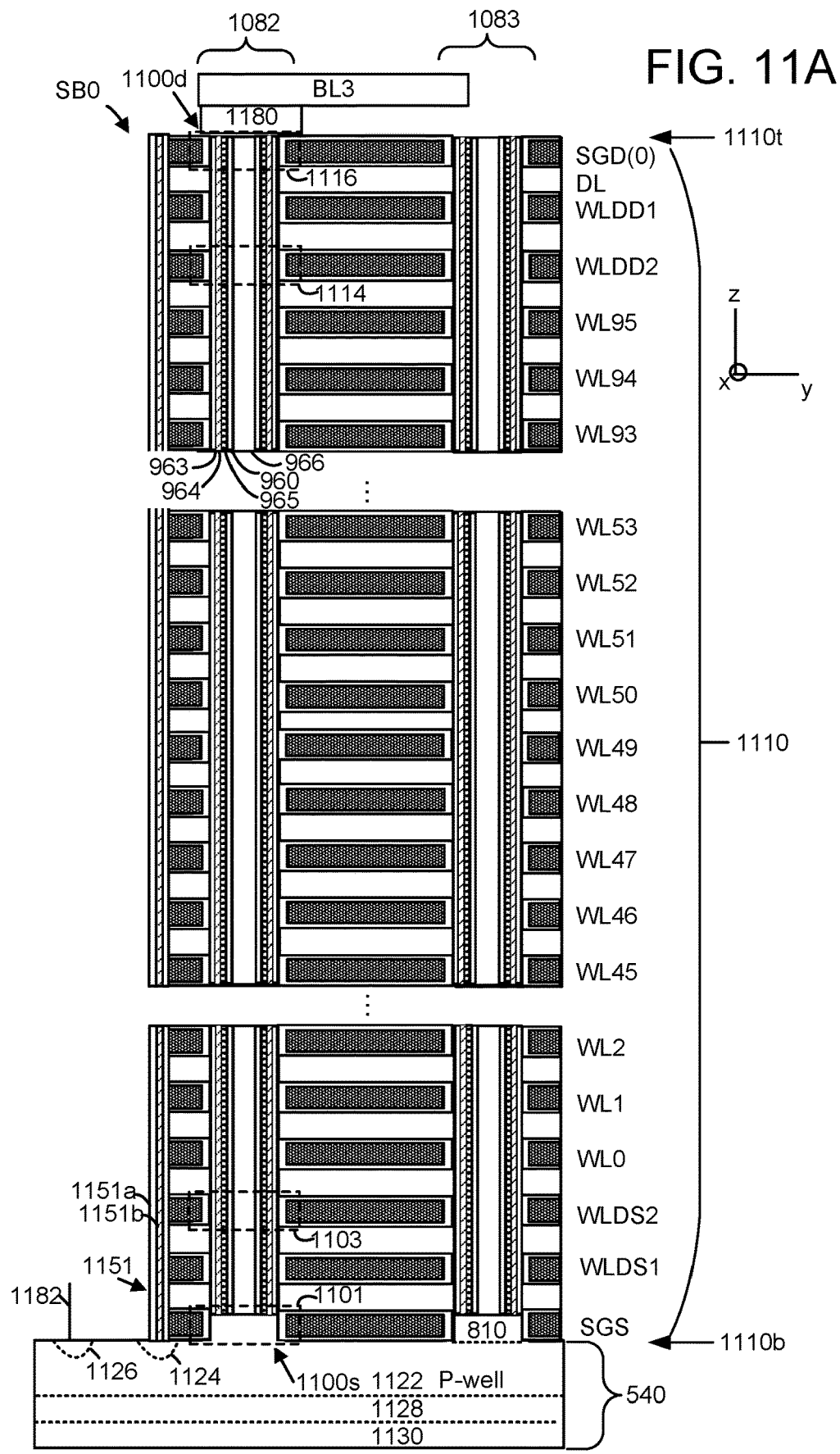
FIGS. 11A-11C depict cross-sectional views of a portion of a sub-block, each depicting two NAND strings above a substrate.

FIG. 11A depicts an example cross-sectional view of a portion of a sub-block, including NAND strings 1082 and 1083, in a single-tier stack. FIG. 11A depicts a cross-sectional view along line AA in FIG. 10A. In this example, the NAND strings 1082 and 1083 are in the same sub-block (e.g., SB0). NAND string 1082 is connected to BL3 (referred to as 1014 in FIG. 10A). The bit line to which NAND string 1083 is connected (1013 in FIG. 10A) is not depicted in FIG. 11A.

The sub-block comprises a stack 1110 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A memory controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the memory controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 11B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 1110t and bottom 1110b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, with select gate transistors formed in regions in which the SGS and SGD control lines intersect with the multiple thin layers. For example, a drain-side select gate transistor 1116 is formed where the SGD control line intersects with the multiple thin layers, a source-side select gate transistor 1101 is formed where the SGS control line intersects with the multiple thin layers, a topmost data memory cell 1114 is formed where the WL95 word line intersects with the multiple thin layers, and a bottom most data memory cell 1103 is formed where the WL0 word line intersects with the multiple thin layers.

The multiple thin layers can form annular layers and can be deposited, e.g., using atomic layer deposition. For example, the layers can include a blocking oxide layer 963, a charge-trapping layer 964 or film such as silicon nitride (Si3N4) or other nitride, a tunneling layer 965 (e.g., a gate oxide) and a channel 960 (e.g., comprising polysilicon). A dielectric core 966 (e.g., comprising silicon dioxide) can also be provided. A word line or control line can comprise a metal such as Tungsten. In this example, all the layers are provided in the memory hole. In other approaches, some of the layers can be provided in the word line or control line layer. The multiple thin layers form a columnar active area (AA) of a NAND string.

The stack is formed on a substrate 540. In one approach, the substrate includes a p-well region 1122 connected to the source ends of the NAND strings. The p-well region may comprise epitaxial regions 1122 which extend upward adjacent to the source-side select gate transistors. The p-well region can include an n+ contact 1124 connected to a local interconnect 1151 for receiving a source line voltage, and a p+ contact 1126 connected to a p-well contact 1182 for receiving a p-well voltage. The local interconnect 1151 can comprise a conductive material 1151b such as metal surrounded by insulating material 1151a to prevent conduction with the metal of the adjacent word lines. The p-well region is formed in an n-well 1128, which in turn is formed in a p-type semiconductor region 1130 of the substrate 540, in one possible implementation.

The NAND string 1082 has a source end 1100s ata bottom 1110b of the stack 1110, connected to the p-well. The NAND string 1082 also has a drain end 1100d at a top 1110t of the stack, connected to a bit line BL3 via a bit line contact 1180 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the channels of the NAND string are charged up, such as by applying a positive erase pulse to the substrate via the local interconnect 1151, causing the electrons to return to the channel from the charge trapping layer.

In this example, the SGS transistors have a body 810, but do not include the multiple thin layers 960, 963, 964 and 965. As a result, there is a reduced likelihood of a Vt shift.

Figure 11B:
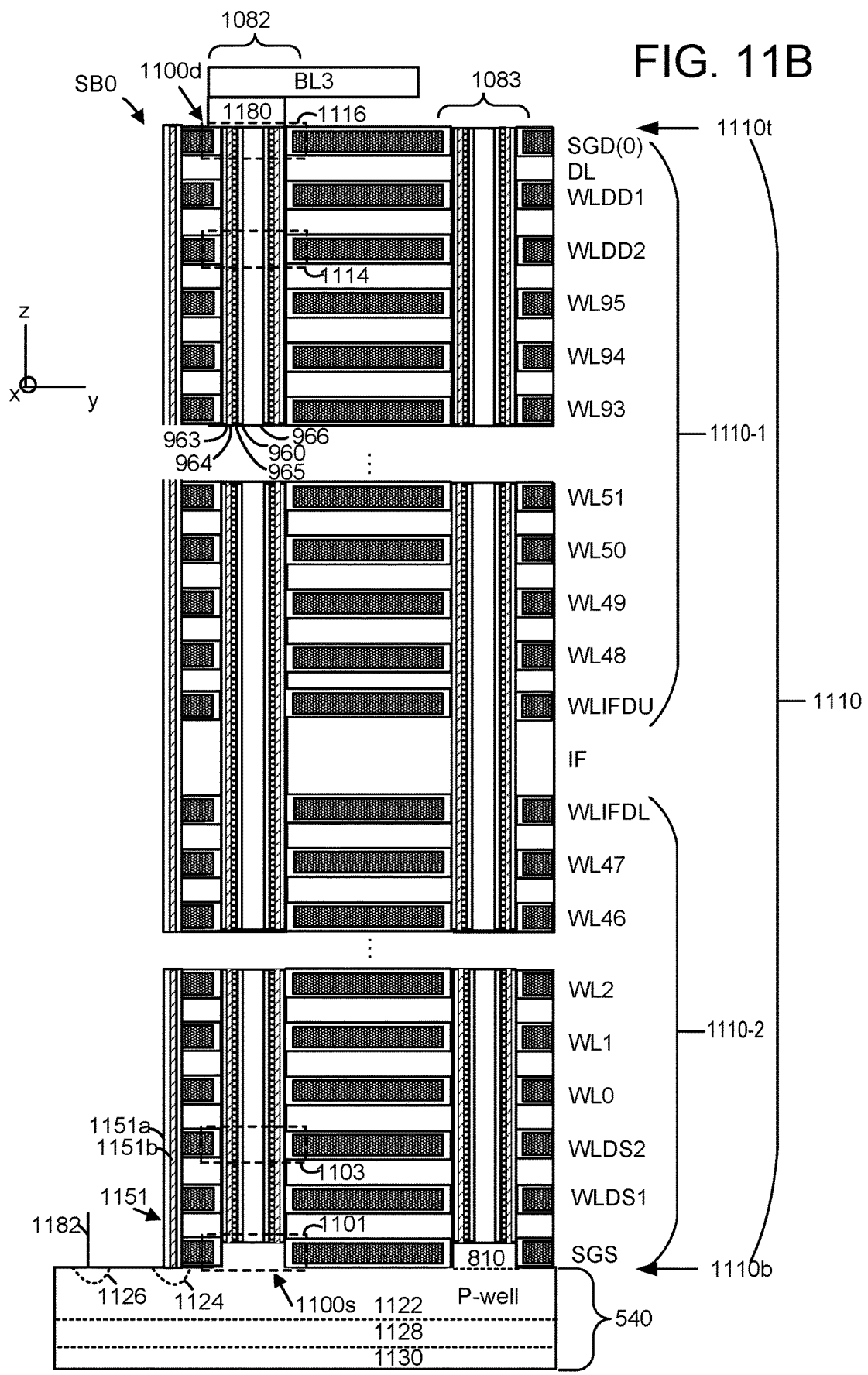

FIG. 11B depicts an example cross-sectional view of a portion of a sub-block, including NAND strings 1082 and 1083, in a two-tier stack comprising an upper tier 1110-1 and a lower tier 1110-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

The configurations of the substrate in FIGS. 11A and 11B may be used when a p-well erase is used. During one embodiment of p-well erase, an erase voltage is applied to the p-well contact 1182. The LI 1151 may be floated and may couple up to the erase voltage. A depletion region (fully or partially) is formed in the p-well region 1122 due to the migration of electrons out of the depletion region toward the n+ contact 1124 and thus holes get accumulated. The resulting holes then migrate from the depletion region into the NAND channel 960 to recombine with trapped electrons in the charge storage regions 964 and thus erase the memory cells.

Figure 11C:
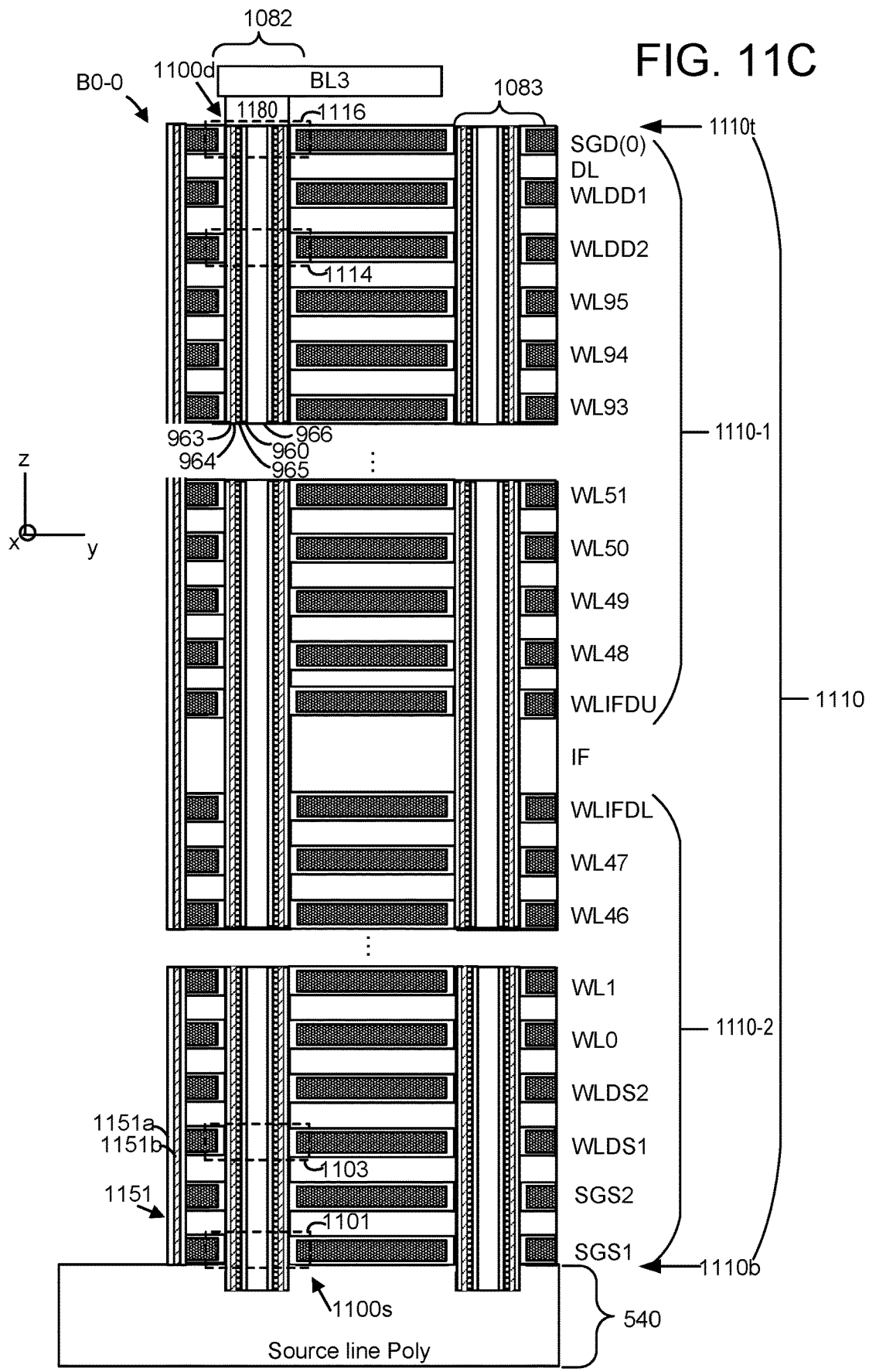

FIG. 11C shows an alternative configuration for the substrate 540. In FIG. 11C, the substrate 540 has a source line, which may be formed form polysilicon. In one embodiment, the source line is n-type polysilicon. In some embodiments, a GIDL erase is used with the substrate configuration of FIG. 11C. For an embodiment of a GIDL erase, the source line is biased to an high potential (e.g., VERA) and the SGS line is biased to a voltage that is lower than VERA to generate GIDL holes at the channel of the SGS transistor. The GIDL holes migrate away from the high potential into the NAND channel to recombine with the trapped electrons in the charge storage regions 964 and erase the memory cells. Other configurations for the substrate 540 are also possible.

Figure 12:
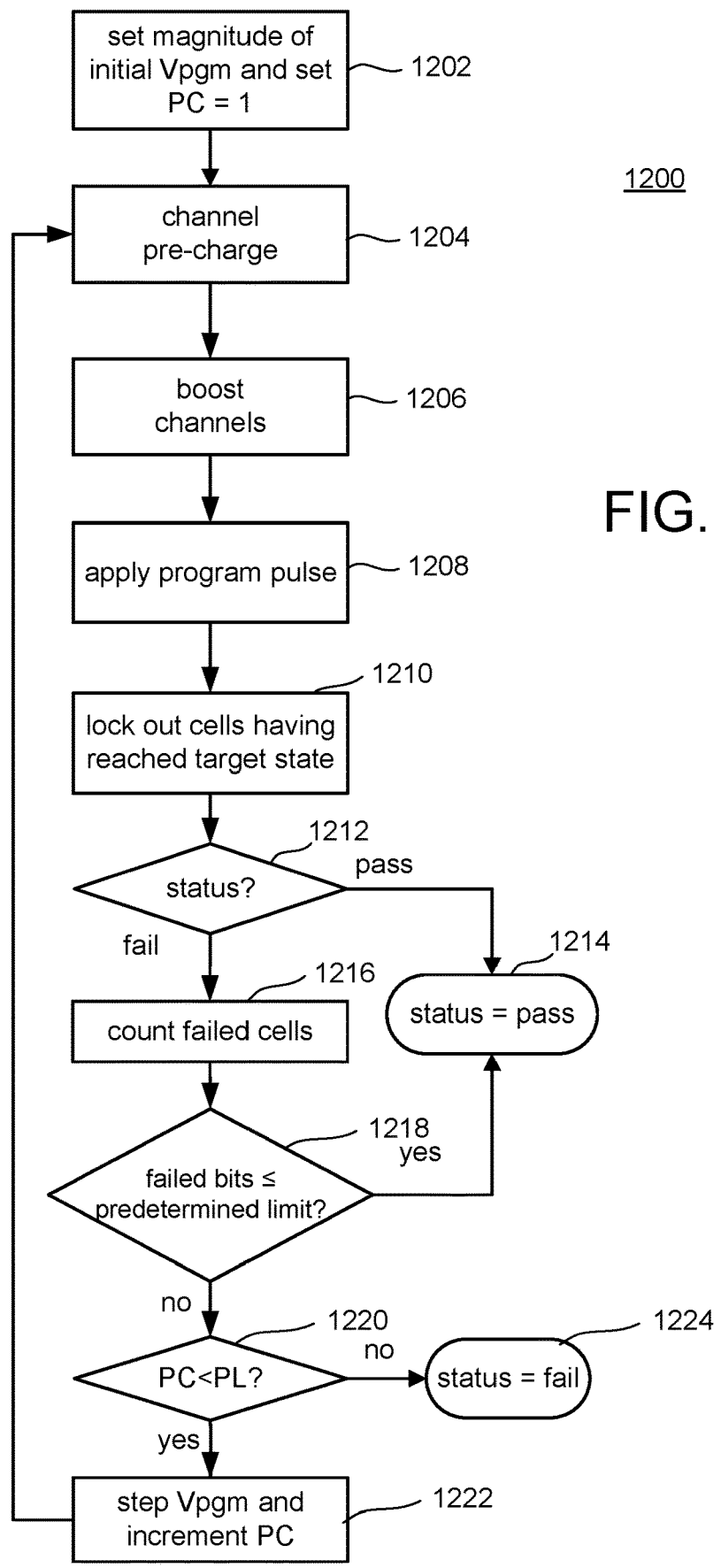
FIG. 12 is a flowchart describing one embodiment of a process for programming NAND strings of memory cells organized into an array.

FIG. 12 is a flowchart describing one embodiment of a process 1200 for programming NAND strings of memory cells. The process of FIG. 12 can be performed at the direction of state machine 362. In one example embodiment, the process of FIG. 12 is performed on memory die 300 using the control circuitry (system control logic 360, column control circuitry 310, row control circuitry 320) discussed above. In one example embodiment, the process of FIG. 12 is performed by integrated memory assembly 307 using the control circuitry (system control logic 360, column control circuitry 310, row control circuitry 320). The process includes multiple loops, each of which includes a program phase (e.g., steps 1204-1208) and a verify phase (e.g., steps 1210-1218).

In many implementations, the magnitude of the program pulses is increased with each successive pulse by a predetermined step size. In step 1202 of FIG. 12, the programming voltage (Vpgm) is initialized to the starting magnitude (e.g., ~12-16V or another suitable level) and a program counter PC maintained by state machine 362 is initialized at 1.

In one embodiment, the set of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1204 the storage system will pre-charge channels of NAND strings that include memory cells connected to the selected word line that are to be inhibited from programming.

In one embodiment, step 1204 is the start of a program operation. In some embodiments, different sets of memory cells are programmed concurrently. For example, programming of memory cells in different memory structures 302 may be performed concurrently. In some embodiments, the start of concurrent program operations (e.g., step 1204) is staggered such that step 1204 occurs at different times for the different memory structures 302.

In step 1206, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1208, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 1208, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all the memory cells connected to the selected word line will concurrently have their Vt change, unless they are inhibited from programming.

In step 1210, memory cells that have reached their target states are locked out from further programming. Step 1210 may include performing verifying at one or more verify reference levels. In one embodiment, the verification process is performed by testing whether the threshold voltages of the memory cells selected for programming have reached the appropriate verify reference voltage.

In step 1210, a memory cell may be locked out after the memory cell has been verified (by a test of the Vt) that the memory cell has reached its target state. If, in step 1212, it is determined that all of the memory cells have reached their target threshold voltages (pass), the programming process is complete and successful because all selected memory cells were programmed and verified to their target states. A status of "PASS" is reported in step 1214. Otherwise if, in step 1212, it is determined that not all the memory cells have reached their target threshold voltages (fail), then the programming process continues to step 1216.

In step 1216, the storage system counts the number of memory cells that have not yet reached their respective target Vt distribution. That is, the system counts the number of memory cells that have, so far, failed to reach their target state. This counting can be done by the state machine 362, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1218, it is determined whether the count from step 1216 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1214. In this situation, enough memory cells programmed correctly such that the few remaining memory cells that have not been completely programmed can be corrected using ECC during the read process. In some embodiments, the predetermined limit used in step 1218 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1220 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 1224. If the program counter PC is less than the program limit value PL, then the process continues at step 1222 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1222, the process loops back to step 1204 and another program pulse is applied to the selected word line so that another iteration (steps 1204-1222) of the programming process of FIG. 12 is performed.

Figure 13A:
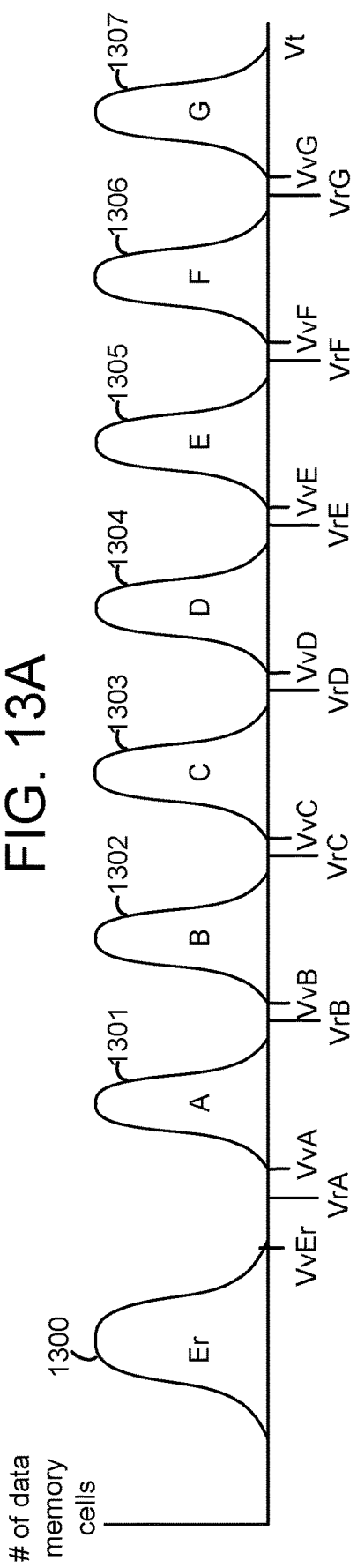
FIG. 13A depicts threshold voltage (Vt) distributions for data memory cells in an eight-state memory device.

FIG. 13A depicts threshold voltage (Vt) distributions for data memory cells in an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vt distributions can represent memory cells connected to a word line or all memory cells in a block. After erasing the block, the Vt distribution 1300 is obtained, representing the erased state. The erase operation is completed when the Vt of all, or nearly all, of the data memory cells is below a verify voltage, VvEr.

During an erase-verify test for data memory cells, the state machine checks the number of upper tail memory cells which have Vt>VvEr. This upper tail is represented by the region 1300a. If the number of memory cells which are sensed as '0' cells, e.g., non-conductive, is larger than predefined value, then another erase pulse and erase-verify are used.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vt distributions 1301-1307, respectively. These memory cells are subject to verify tests using verify voltages of VvA-VvG.

Figure 13B:
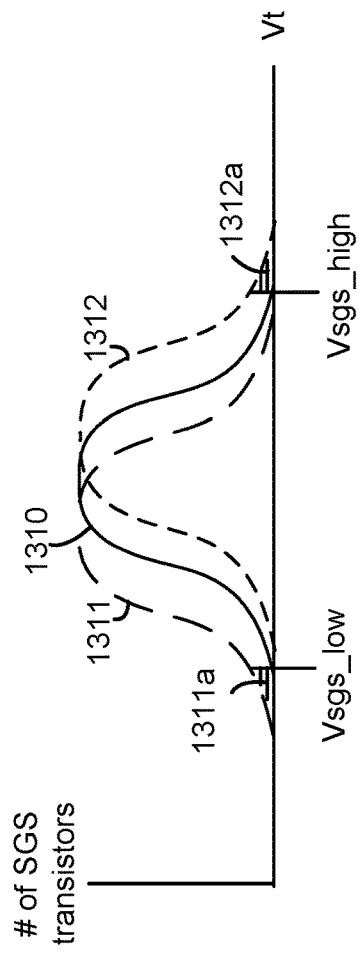
FIG. 13B depicts example Vt distributions for source side select gate transistors.

FIG. 13B depicts example Vt distributions for source side select transistors, including a normal Vt distribution 1310, a downshifted Vt distribution 1311 and an upshifted Vt distribution 1312. For an architecture such as in FIG. 11C, the SGS transistor has a charge trap layer 964 such that it is possible for a change in the amount of charge stored in the charge trap layer to alter the Vt of the SGS transistor. For an architecture such as FIG. 9A, 9B, 11A or 11B, the SGS transistor does not have a charge trap layer. However, it is still possible for the Vt to change due to factors such as a defect 816 in the SGS transistor. The shift may worsen as program-erase cycles accumulate.

A respective allowable range of threshold voltages can be defined which extends between boundary voltages of Vsgs_low and Vsgs_high. If the Vt of the SGS transistor is too low or high, it can be difficult to turn off or on, respectively. To determine if a set of SGS transistors, such as the SGS transistors in a sub-block, are out-of-range below a minimum allowable level, the SGS transistors can be verified while applying Vsgs_low to their control gates. The conductive SGS transistors, represented by the region 1311a, can then be identified as being out-of-range. To determine if the set of SGS transistors are out-of-range above a maximum allowable level, the SGS transistors can be verified while applying Vsgs_high to their control gates. The non-conductive SGS transistors, represented by the region 1312a, can then be identified as being out-of-range. For the detection of the upper and lower tails of the SGS transistors after an SGS stress test, the state machine can check for '0' cells (upper tail) or '1' cells (lower tail).

In some embodiments, the SGS transistors in a block are stress tested prior to erasing the block. The stress test may be used to determine whether an electrical short of an SGS transistor to the substrate (or source line) is negatively impacting the SGS transistors in a sub-block or block. If so, then the block may be operated in a sub-block mode that avoids use of the negatively impacted SGS transistors. Hence, data can still be stored in a portion of the block that does not require the negatively impacted SGS transistors to erase, write, and read data.

Figure 14:
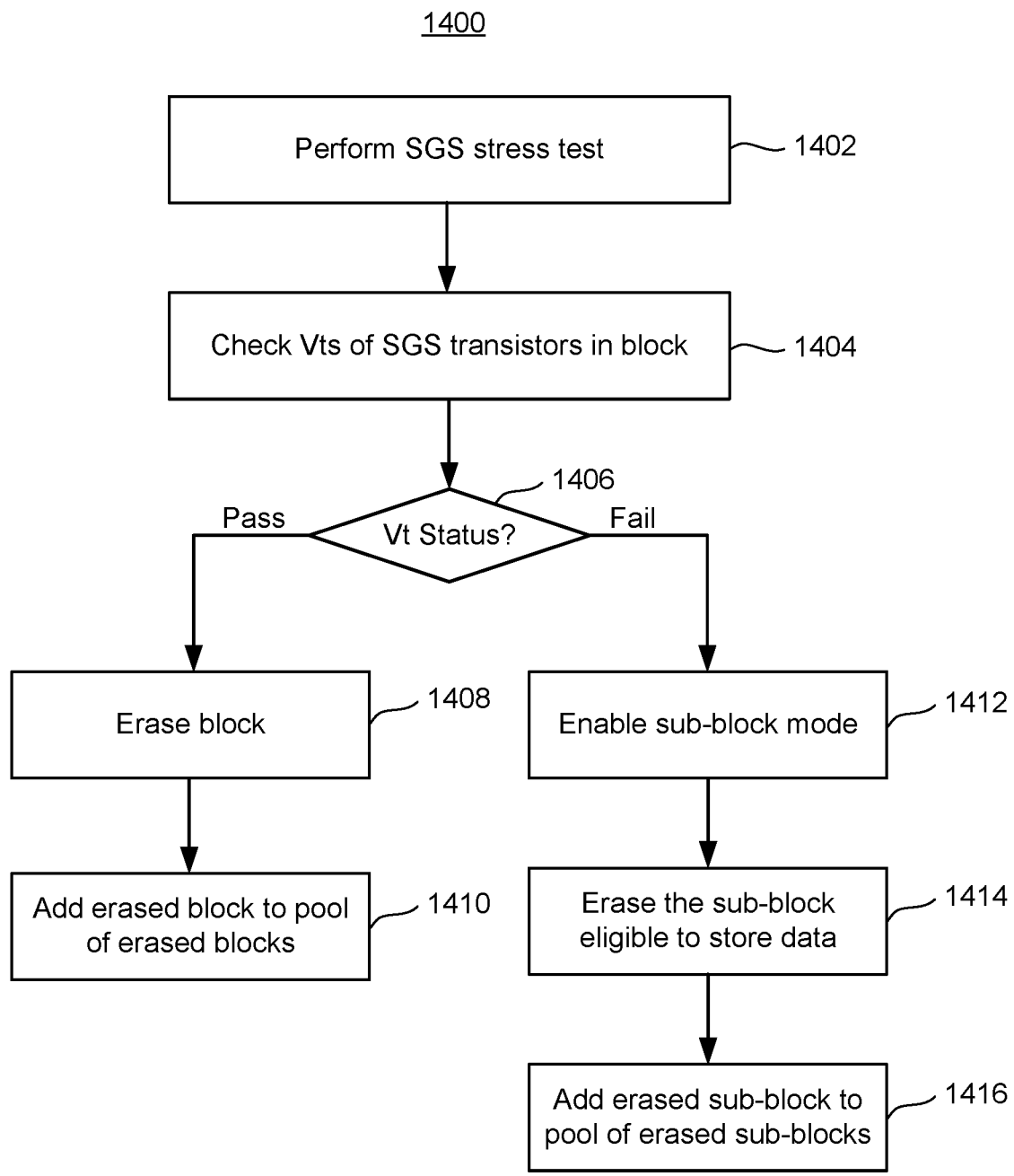
FIG. 14 is a flowchart of one embodiment of a process of managing SGS transistors in conjunction with erasing a block of memory cells.

FIG. 14 is a flowchart of one embodiment of a process 1400 of managing SGS transistors in conjunction with erasing a block of memory cells. The process 1400 may be controlled by a combination of memory controller 102 and system control logic 360 in memory die 300 or control die 311. The process 1400 may be initiated prior to erasing a block of memory cells. Step 1402 includes performing an SGS stress test. In an embodiment, the SGS stress test places a stress voltage between the control gate of an SGS transistor and the substrate below the SGS transistor. Since the substrate is electrically connected to the body 810 of the SGS transistor, this may also place a stress voltage between the control gate and the body 810. In an embodiment, the system control logic 360 controls the stress test.

Step 1404 includes checking a Vts of SGS transistors in the block. In one embodiment, the SGS transistors are tested on a sub-block basis (e.g., SB0, SB1, SB2, SB3). A Vt distribution for each sub-block may be determined. With reference to FIG. 13B, the Vt distribution has an allowed range between Vsgd_low and Vsgd_high. In one embodiment, if more than a pre-determined number of SGS transistors have a Vt below Vsgd_low or if more than a pre-determined number of SGS transistors have a Vt above Vsgd_high, then the Vt distribution is considered out of the allowed range. In one embodiment, the Vt distribution is considered out of the allowed range if more than a pre-determined number of SGS transistors have a Vt below Vsgd_low (i.e., the upper limit is not tested regardless of the lower limit test result). In one embodiment, the Vt distribution is considered out of the allowed range if more than a pre-determined number of SGS transistors have a Vt above Vsgd_high (i.e., the lower limit is not tested regardless of the upper limit test result). In an embodiment, the system control logic 360 checks the Vts and determines the counts of SGS transistors having a Vt out of the allowed range. The system control logic 360 may provide a pass/fail result to the memory controller 102.

Step 1406 includes a determination of whether the Vt test passed (e.g., Vts met a criterion). If the Vt test passed, then control passes to step 1408. Step 1408 includes erasing memory cells in the block. Step 1410 includes adding the erased block to a pool of erased blocks. The entire block is eligible to store data.

If the Vt test failed, then control passes to step 1412. Step 1412 includes enabling a sub-block mode. In the sub-block mode, one or more sub-blocks are not eligible to store data; however, one or more sub-blocks are eligible to store data. Any sub-block that contains a set of SGS transistors that failed the Vt test is not eligible to store data. Sub-blocks that do not contain a set of SGS transistors that failed the Vt test are eligible to store data.

One way to divide a block of memory cells into sub-blocks is based on tiers of a 3D memory structure. FIG. 11B depicts an embodiment in which there are two tiers. There is an upper tier 1110-1 and a lower tier 1110-2. Since only the lower tier 1110-2 contains SGS transistors, the upper tier 1110-1 remains eligible to store data. However, the lower tier 1110-2 is no longer eligible to store data. In this context, the upper tier 1110-1 may be referred to as an upper sub-block. The lower tier 1110-2 may be referred to as a lower sub-block.

Another way to divide a block of memory cells into sub-blocks is based on the way in which the 3D memory structure may be divided horizontally. FIGS. 10A-10D provide example of possible horizontal divisions. One example of such horizontal divisions within a block are referred to herein as SB0, SB1, SB2, and SB3 (see FIGS. 10A, 10B). Another example of horizontal divisions within a block are referred to herein as fingers. For example, FIG. 10D depicts a first finger (regions 1020 and 1030) and a second finger (regions 1040 and 1050). If the SGS transistors in the first finger passed the Vt test, but the SGS transistors in the second finger failed the Vt test, then first finger remains eligible to store data with the second finger being no longer eligible to store data.

Step 1414 includes erasing the sub-block(s) that remain eligible to store data. Step 1416 includes adding the erased sub-block(s) to a pool of erased sub-blocks. The sub-block(s) that are no longer eligible to store data are tagged as no longer being eligible to store data. For example, the memory controller 102 may store a list of sub-blocks that are not eligible to store data.

Figures 15A, 15B:
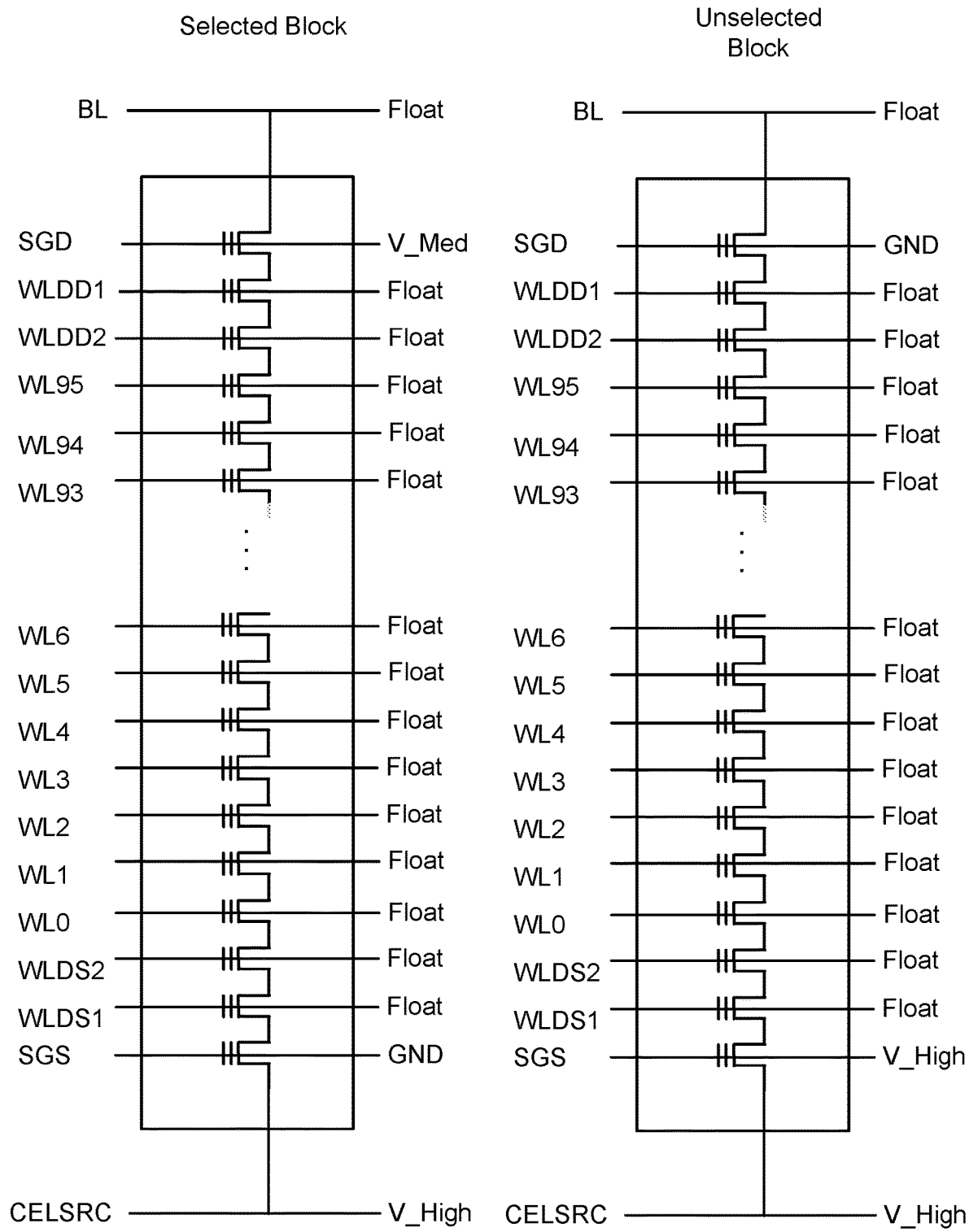
FIGS. 15A and 15B show voltages that are applied in a 3D memory structure during an embodiment of an SGS stress test.

FIGS. 15A and 15B show voltages that are applied in the 3D memory structure during an embodiment of an SGS stress test. These voltages are applied during one embodiment of step 1402 of process 1400. FIG. 15A depicts voltages applied to a selected block. FIG. 15B depicts voltages that are applied to an unselected block. FIG. 15A shows that a high voltage (V_High) is applied to CELSRC while a low voltage (e.g., GND) is applied to the SGS. The voltage difference between the CELSRC and SGS is one embodiment of the SGS stress voltage. The word lines (both data WLs and dummy WLs) are floated. The bit line (BL) is floated. A medium voltage (V_Med) is applied to the SGD. An example of V_High is about 17V. However, V_High could be higher or lower than 17V. An example of V_Med is 12V. However, V_Med could be higher or lower than 12V. In an embodiment, V_Med is about 5V less than V_High. However, V_Med could be closer or further in magnitude from V_High.

FIG. 15B shows that the high voltage (V_High) is applied to both CELSRC and o the SGS in the unselected block. The word lines (both data WLs and dummy WLs) are floated. The bit lines (BLs) are floated. The SGD line is grounded.

FIGS. 16A and 16B show voltages that are applied in the 3D memory structure during an embodiment of an SGS stress test. These voltages are applied during one embodiment of step 1402 of process 1400. FIG. 16A depicts voltages applied to a selected block. FIG. 16B depicts voltages that are applied to an unselected block. FIG. 16A shows that a high voltage (V_High) is applied to the SGS while a low voltage (e.g., GND) is applied to the CELSRC. The voltage difference between the CELSRC and SGS is one embodiment of the SGS stress voltage. The word lines (both data WLs and dummy WLs) are floated. The bit line (BL) is floated. A medium voltage (V_Med) is applied to the SGD. An example of V_High is about 17V. However, V_High could be higher or lower than 17V. An example of V_Med is 12V. However, V_Med could be higher or lower than 12V. In an embodiment, V_Med is about 5V less than V_High. However, V_Med could be closer or further in magnitude from V_High.

FIG. 16B shows that the low voltage (GND) is applied to both CELSRC and the SGS in the unselected block. The word lines (both data WLs and dummy WLs) are floated. The bit lines (BLs) are floated. The SGD line is grounded.

Figure 17:
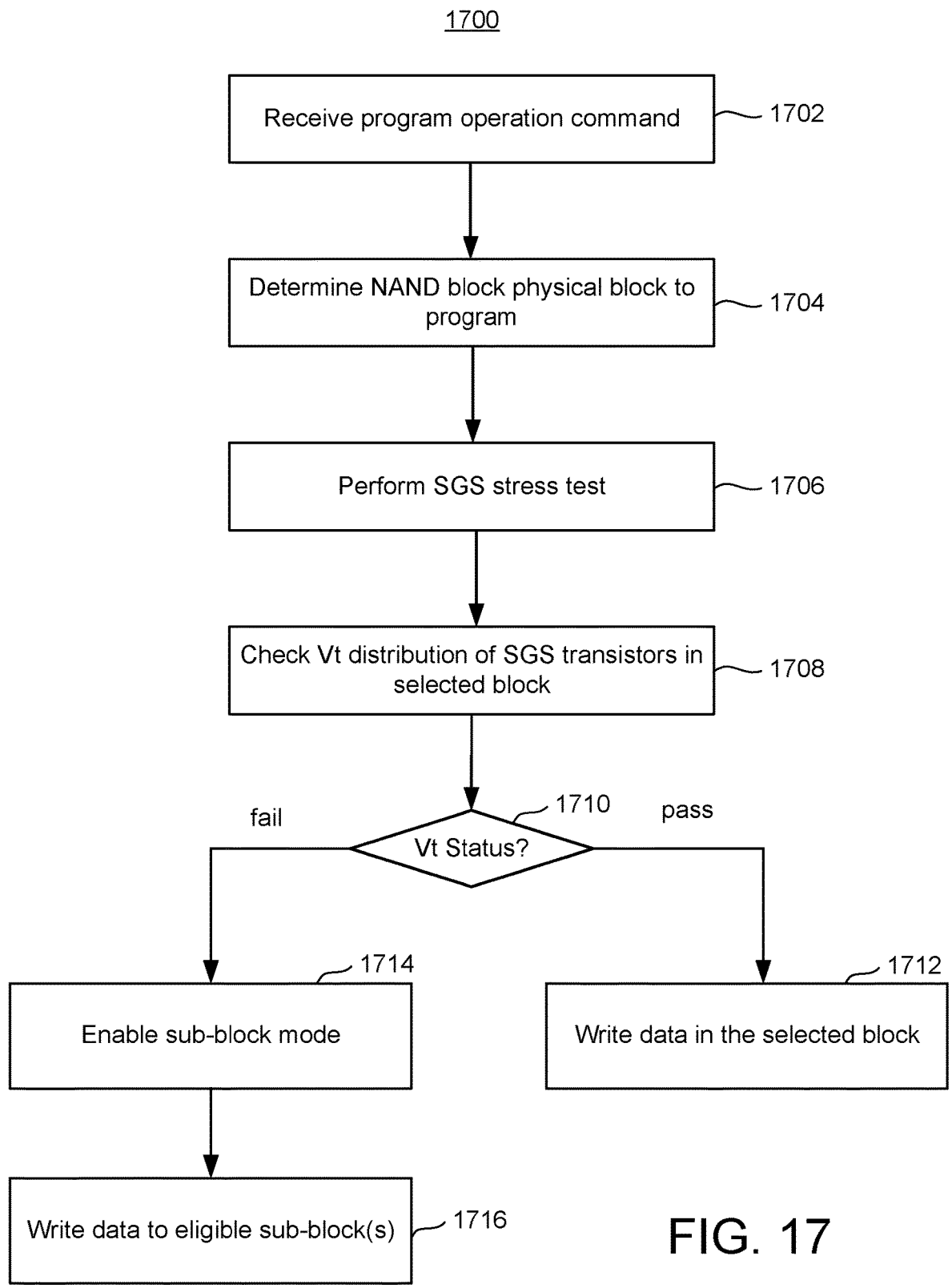
FIG. 17 is a flowchart of one embodiment of a process of managing SGS transistors in conjunction with programming a block of memory cells.

In some embodiments, the SGS stress test of a selected block is performed prior to an erase of the selected block. In one embodiment, the SGS stress test is performed after the block is erased, but prior to programming the block. FIG. 17 depicts of flowchart of one embodiment of a process 1700 in which the SGS stress test of a selected block is performed after erase but prior to programming.

Step 1702 include receiving a program operation. For example, memory controller 102 receives a program command from the host system 120. Step 1704 includes determining a NAND physical block to program. The memory controller 102 may select an erased block from a pool of erased blocks. Step 1706 includes performing an SGS stress test for the selected block. In one embodiment, the voltages depicted in FIG. 15A are applied to the selected block. Step 1708 includes checking the Vt distribution of the SGS transistors in the selected block. This may include testing each sub-block (e.g., SB0, SB1, SB2, SB3) separately. Step 1710 includes a determination of whether the Vt stress test passed. A separate result may be provided for each sub-block (e.g., SB0, SB1, SB2, SB3). Alternatively, a separate result may be provided for each finger. For example, the Vt distribution of finger one (e.g., SB0, SB1) may be tested. Also, the Vt distribution of finger two (e.g., SB2, SB3) may be tested. In some cases, a single Vt distribution for the entire block may be tested.

If the Vt test passes for all SGS transistors in the selected block, then data is written in the selected block in step 1712.

If the Vt test fails for any set of SGS transistors in the selected block (e.g., sub-block, finger, or block) then a sub-block mode is entered in step 1714. In step 1714, a portion of the block that contains the SGS transistors that failed the Vt test is tagged as ineligible to store data. In one embodiment, the lower tier is tagged as ineligible to store data. In one embodiment, one of the fingers is tagged as ineligible to store data. In one embodiment, one of more sub-blocks (e.g., SB0, SB1, SB2, SB3) are tagged as ineligible to store data. In step 1716 data is written to a sub-block (or sub-blocks) that remain eligible to store data.

In view of the foregoing, it can be seen that one embodiment includes an apparatus, comprising one or more control circuits configured to connect to a plurality of NAND strings having memory cells. The one or more control circuits are configured to connect to a three-dimensional memory structure having memory holes. The memory holes comprise regular memory holes having NAND strings. Each NAND string having a regular source side select transistor having a body in electrical contact with a substrate below the three-dimensional memory structure. The one or more control circuits configured to apply a first voltage to control gates of a group of the regular source side select transistors while applying a second voltage to the substrate. The second voltage is different in magnitude from the first voltage. The one or more control circuits configured to determine whether threshold voltages of the group of the regular source side select transistors meet a criterion after the first voltage is applied to the control gates and the second voltage is applied to the substrate. The one or more control circuits configured to determine that the group of the regular source side select transistors are ineligible to be used to control write operations in the three-dimensional memory structure if the threshold voltages of the group fails to meet the criterion.

In a second embodiment, in furtherance of the first embodiment, the memory holes comprise a first group of dummy memory holes each comprising a dummy source side select transistor having a body in electrical contact with the substrate. Control gates of a first group of the dummy source side select transistors are electrically connected to the control gates of a first group of the regular source side select transistors. The one or more control circuits are configured to apply the first voltage to control gates of the first group of the dummy source side select transistors while applying the second voltage to the substrate.

In a third embodiment, in furtherance of the first or second embodiment, the three-dimensional memory comprises blocks of the NAND string. A first group of the regular source side select transistors reside in a first block of the NAND strings. The one or more control circuits are further configured to enable a sub-block mode if the threshold voltages of the first group of the regular source side select transistors fails to meet the criterion. In the sub-block mode data is not written to memory cells in a first portion of the first block and data is written to memory cells in a second portion of the first block. The first portion contains the first group of the regular source side select transistors having threshold voltages that failed to meet the criterion. The second portion does not contain the first group of the regular source side select transistors having threshold voltages that failed to meet the criterion.

In a fourth embodiment, in furtherance of the third embodiment, the three-dimensional memory structure has plurality of horizontal conductive layers that comprise an upper tier of conductive layers and a lower tier of conductive layers. The regular source side select transistors reside in the lower tier. The first portion of the first block comprises the lower tier. The second portion of the first block comprises the upper tier.

In a fifth embodiment, in furtherance of the third embodiment, the first block comprises a plurality of source side select lines. The first portion of the first block comprises a first source side select line connected to the first group of the regular source side select transistors having threshold voltages that failed to meet the criterion. The second portion of the first block comprises only source side select lines for which the threshold voltages of a group of the regular source side select transistors meets the criterion.

In a sixth embodiment, in furtherance of any of the first to fifth embodiments, criterion is whether a threshold voltage distribution of the group of the regular source select transistors is within an allowed range.

In a seventh embodiment, in furtherance of any of the first to sixth embodiments, the first voltage is substantially ground. The second voltage has a magnitude of an erase voltage that is applied to the substrate to erase the NAND strings.

In an eighth embodiment, in furtherance of any of the first to seventh embodiments, the group of the regular source side select transistors reside in a selected block of the NAND strings. The one or more control circuits are further configured to apply the second voltage to control gates of source side select transistors in unselected blocks while applying the second voltage to the substrate and while applying the first voltage to the control gates of the group of the regular source side select transistors in the selected block.

In a ninth embodiment, in furtherance of the any of the first to eighth embodiments, the one or more control circuits are further configured to the control gates of the group of the regular source side select transistors are connected to a source side select line in a selected block of the NAND strings. The one or more control circuits are further configured to perform the following while applying the first voltage to the source side select line in the selected block while applying the second voltage to the substrate: float bit lines associated with the selected block, float word lines connected to the NAND strings of the selected block, apply a third voltage having a magnitude between the first voltage and the second voltage to a drain side select line in the selected block.

In a tenth embodiment, in furtherance of any of the first to ninth embodiments, the control gates of the group of the regular source side select transistors are connected to a source side select line in a selected block of the NAND strings. The one or more control circuits are further configured to perform the following while applying the first voltage to the source side select line in the selected block while applying the second voltage to the substrate: float bit lines associated with unselected blocks; float word lines connected to NAND strings of the unselected blocks; and ground drain side select lines in the unselected blocks.

In an eleventh embodiment, in furtherance of any of the first to tenth embodiments, the apparatus comprises a first semiconductor die comprising the three-dimensional memory structure. The apparatus comprises a second semiconductor die affixed to the first semiconductor die, the second semiconductor comprising the one or more control circuits.

One embodiment includes a method of operating non-volatile storage. The method comprises applying, by a control circuit connected to a three-dimensional memory structure having blocks of NAND strings in a memory array region and dummy source side select transistors in a terrace region, a stress voltage to a select line connected to a group of dummy source side select transistors in the terrace region and to regular source side select transistors in a selected block of the NAND strings. The method comprises determining, by the control circuit, whether a threshold voltage (Vt) distribution of one or more groups of the regular source side select transistors in the selected block is within an allowed range after applying the stress voltage to the select line. The method comprises marking, by the control circuit, a first portion of the selected block having a group of the regular source side select transistors having a Vt distribution outside of the allowed range after applying the stress voltage as not eligible to store data. The method comprises writing data, by the control circuit, to a second portion of the selected block that does not contain any groups of the regular source side select transistors having a Vt distribution outside of the allowed range after applying the stress voltage.

One embodiment includes a non-volatile storage system, comprising a three-dimensional memory structure formed over a substrate and comprising blocks of NAND strings. Each block has a source side select line associated with the NAND strings. Each NAND string has a source side select transistor associated with the source side select line. Each source side select transistor has a body in electrical contact with a source line in the substrate. The non-volatile storage system comprises one or more control circuits in communication with the three-dimensional memory structure. The one or more control circuits: apply a stress voltage between the substrate and the select line in a selected block; test whether a threshold voltage (Vt) distribution of the source side select transistors in the selected block meets a criterion after applying the stress voltage; erase the selected block and tag the erased selected block as eligible to store data if the Vt distribution of the source side select transistors in the selected block meets the criterion after applying the stress voltage; and enable a sub-block mode if the Vt distribution of the source side select transistors in the selected block does not meet the criterion after applying the stress voltage. The sub-block mode includes erasing a first sub-block of the selected block and tagging a second sub-block of the selected block as not eligible to store data. The first sub-block contains only source side select transistors having a Vt distribution that met the criterion applying the stress voltage. The second sub-block contains source side select transistors having a Vt distribution that did not meet the criterion applying the stress voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure having memory holes, the memory holes comprising regular memory holes having NAND strings, each NAND string having a regular source side select transistor having a body in electrical contact with a substrate below the three-dimensional memory structure, the one or more control circuits configured to:
apply a first voltage to control gates of a group of the regular source side select transistors while applying a second voltage to the substrate, wherein the second voltage is different in magnitude from the first voltage;
determine whether threshold voltages of the group of the regular source side select transistors meet a criterion after the first voltage is applied to the control gates and the second voltage is applied to the substrate; and
determine that the group of the regular source side select transistors are ineligible to be used to control write operations in the three-dimensional memory structure when the threshold voltages of the group fails to meet the criterion.

2. The apparatus of claim 1, wherein:
the memory holes comprise a first group of dummy memory holes each comprising a dummy source side select transistor having a body in electrical contact with the substrate, wherein control gates of a first group of the dummy source side select transistors are electrically connected to the control gates of a first group of the regular source side select transistors; and
the one or more control circuits are configured to apply the first voltage to control gates of the first group of the dummy source side select transistors while applying the second voltage to the substrate.

3. The apparatus of claim 1, wherein:
the three-dimensional memory comprises blocks of the NAND strings, a first group of the regular source side select transistors reside in a first block of the NAND strings; and
the one or more control circuits are further configured to enable a sub-block mode if the threshold voltages of the first group of the regular source side select transistors fails to meet the criterion, wherein in the sub-block mode data is not written to memory cells in a first portion of the first block and data is written to memory cells in a second portion of the first block, the first portion containing the first group of the regular source side select transistors having threshold voltages that failed to meet the criterion, the second portion not containing the first group of the regular source side select transistors having threshold voltages that failed to meet the criterion.

4. The apparatus of claim 3, wherein:
the three-dimensional memory structure has plurality of horizontal conductive layers that comprise an upper tier of conductive layers and a lower tier of conductive layers, wherein the regular source side select transistors reside in the lower tier;
the first portion of the first block comprises the lower tier; and
the second portion of the first block comprises the upper tier.

5. The apparatus of claim 3, wherein:
the first block comprises a plurality of source side select lines;
the first portion of the first block comprises a first source side select line connected to the first group of the regular source side select transistors having threshold voltages that failed to meet the criterion; and
the second portion of the first block comprises only source side select lines for which the threshold voltages of a group of the regular source side select transistors meets the criterion.

6. The apparatus of claim 1, wherein the criterion is whether a threshold voltage distribution of the group of the regular source select transistors is within an allowed range.

7. The apparatus of claim 1, wherein:
the first voltage is substantially ground; and
the second voltage has a magnitude of an erase voltage that is applied to the substrate to erase the NAND strings.

8. The apparatus of claim 1, wherein:
the group of the regular source side select transistors reside in a selected block of the NAND strings; and
the one or more control circuits are further configured to apply the second voltage to control gates of source side select transistors in unselected blocks while applying the second voltage to the substrate and while applying the first voltage to the control gates of the group of the regular source side select transistors in the selected block.

9. The apparatus of claim 1, wherein:
the control gates of the group of the regular source side select transistors are connected to a source side select line in a selected block of the NAND strings; and
the one or more control circuits are further configured to perform the following while applying the first voltage to the source side select line in the selected block while applying the second voltage to the substrate:
float bit lines associated with the selected block, float word lines connected to the NAND strings of the selected block, apply a third voltage having a magnitude between the first voltage and the second voltage to a drain side select line in the selected block.

10. The apparatus of claim 1, wherein:
the control gates of the group of the regular source side select transistors are connected to a source side select line in a selected block of the NAND strings; and
the one or more control circuits are further configured to perform the following while applying the first voltage to the source side select line in the selected block while applying the second voltage to the substrate:
float bit lines associated with unselected blocks;
float word lines connected to NAND strings of the unselected blocks; and
ground drain side select lines in the unselected blocks.

11. The apparatus of claim 1, wherein the apparatus comprises:
a first semiconductor die comprising the three-dimensional memory structure; and
a second semiconductor die affixed to the first semiconductor die, the second semiconductor comprising the one or more control circuits.

12. A method of operating non-volatile storage, the method comprising:
applying, by a control circuit connected to a three-dimensional memory structure having blocks of NAND strings in a memory array region and dummy source side select transistors in a terrace region, a stress voltage to a select line connected to a group of dummy source side select transistors in the terrace region and to regular source side select transistors in a selected block of the NAND strings;

determining, by the control circuit, whether a threshold voltage (Vt) distribution of one or more groups of the regular source side select transistors in the selected block is within an allowed range after applying the stress voltage to the select line;

marking, by the control circuit, a first portion of the selected block having a group of the regular source side select transistors having a Vt distribution outside of the allowed range after applying the stress voltage as not eligible to store data; and writing data, by the control circuit, to a second portion of the selected block that does not contain any groups of the regular source side select transistors having a Vt distribution outside of the allowed range after applying the stress voltage.

13. The method of claim 12, wherein applying the stress voltage to the select line comprises:
applying a high voltage to a substrate below the three-dimensional memory structure while grounding the select line.

14. The method of claim 12, further comprising:
floating bit lines associated with the selected block while applying the stress voltage to the select line; and
floating word lines connected to the NAND strings of the selected block while applying the stress voltage to the select line.

15. The method of claim 13, further comprising:
floating bit lines associated with unselected blocks of NAND strings in the three-dimensional memory structure;
floating word lines connected to the NAND strings of the unselected blocks; and
grounding drain side select lines in the unselected blocks.

16. A non-volatile storage system comprising:
a three-dimensional memory structure formed over a substrate and comprising blocks of NAND strings, each block having a source side select line associated with the NAND strings, each NAND string having a source side select transistor associated with the source side select line, each source side select transistor having a body in electrical contact with a source line in the substrate; and
one or more control circuits in communication with the three-dimensional memory structure, the one or more control circuits:
apply a stress voltage between the source line and the select line in a selected block;
test whether a threshold voltage (Vt) distribution of the source side select transistors in the selected block meets a criterion after applying the stress voltage;
erase the selected block and tag the erased selected block as eligible to store data if the Vt distribution of the source side select transistors in the selected block meets the criterion after applying the stress voltage; and
enable a sub-block mode if the Vt distribution of the source side select transistors in the selected block does not meet the criterion after applying the stress voltage, including erasing a first sub-block of the selected block and tagging a second sub-block of the selected block as not eligible to store data, wherein the first sub-block contains only source side select transistors having a Vt distribution that met the criterion applying the stress voltage, wherein the second sub-block contains source side select transistors having a Vt distribution that did not meet the criterion applying the stress voltage.

17. The non-volatile storage system of claim 16, wherein applying the stress voltage comprises:
grounding the source side select line in the selected block while applying a high voltage to the source line.

18. The non-volatile storage system of claim 17, wherein:
well-formed source side select transistors have a dielectric that provides electrical insulation between the source side select line and the body of the well-formed source side select transistor; and
the stress voltage creates a leakage current between the source side select line and the bodies of source side select transistors having defects.

19. The non-volatile storage system of claim 16, wherein:
the three-dimensional memory structure comprises an upper tier and a lower tier;
the source side select transistors reside in the lower tier;
the first sub-block comprises the upper tier; and
the second sub-block comprises the lower tier.

20. The non-volatile storage system of claim 16, wherein:
the selected block comprises a plurality of source side select lines;
the first sub-block comprises only source side select lines for which the source side select transistors met the criterion after applying the stress voltage to the source side select line; and
the second sub-block comprises a source side select line for which the source side select transistors did not meet the criterion applying the stress voltage to the source side select line.

* * * * *